(12) United States Patent
Janjua et al.

(10) Patent No.: US 11,386,967 B2
(45) Date of Patent: Jul. 12, 2022

(54) VOLTAGE GENERATOR AND MEMORY DEVICE INCLUDING THE SAME

(71) Applicant: Samsung Electronics Co., Ltd., Suwon-si (KR)

(72) Inventors: Bilal Ahmad Janjua, Suwon-si (KR); Sungwhan Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/217,346

(22) Filed: Mar. 30, 2021

(65) Prior Publication Data
US 2022/0068404 A1   Mar. 3, 2022

(30) Foreign Application Priority Data
Sep. 1, 2020   (KR) .......................... 10-2020-0111051

(51) Int. Cl.
| | | |
|---|---|---|
| *G11C 16/06* | (2006.01) | |
| *G11C 16/30* | (2006.01) | |
| *G11C 16/04* | (2006.01) | |
| *G11C 16/08* | (2006.01) | |
| *G05F 1/575* | (2006.01) | |

(52) U.S. Cl.
CPC .......... *G11C 16/30* (2013.01); *G11C 16/0483* (2013.01); *G11C 16/08* (2013.01); *G05F 1/575* (2013.01)

(58) Field of Classification Search
CPC ..... G11C 16/30; G11C 16/0483; G11C 16/08; G11C 5/144; G11C 5/147; G11C 8/08; G05F 1/575
See application file for complete search history.

(56) References Cited

U.S. PATENT DOCUMENTS 6,650,173 B1   11/2003   Khouri et al.
6,778,112 B1   8/2004   Chen
(Continued)

FOREIGN PATENT DOCUMENTS

| CN | 207352966 U | 5/2018 |
| CN | 108206040 A | 6/2018 |
| KR | 101274700 B1 | 6/2013 |

OTHER PUBLICATIONS

Extended European Search Report dated Nov. 12, 2021 issued in corresponding European Patent Application No. 21178562.1-1203.

*Primary Examiner* — Hien N Nguyen
(74) *Attorney, Agent, or Firm* — Harness, Dickey & Pierce, P.L.C.

(57) ABSTRACT

A memory device including a memory cell area having a plurality of memory cells, and a peripheral circuit area including peripheral circuits configured to control the memory cells, the peripheral circuits connected to the memory cells by at least a portion of bit lines, word lines, and select lines may be provided. The peripheral circuits may include a reference voltage generator configured to output at least one reference voltage in response to control data of a control logic. The reference voltage generator may include a first resistor chain including first resistors connected in series between a first power node and a second power node, a second resistor chain including second resistors connected in series between the first power node and the second power node, and a plurality of decoders connected to the first resistor chain and the second resistor chain.

20 Claims, 23 Drawing Sheets

(56) References Cited

U.S. PATENT DOCUMENTS

| | | |
|---|---|---|
| 8,884,799 B2 | 11/2014 | Price et al. |
| 9,100,045 B2 | 8/2015 | Dempsey |
| 9,397,688 B2 | 7/2016 | Shill |
| 10,340,935 B1 | 7/2019 | Tanabe et al. |
| 2002/0118568 A1* | 8/2002 | Tanzawa ................. G11C 5/147 365/185.11 |
| 2004/0119626 A1 | 6/2004 | Lien |
| 2009/0115500 A1 | 5/2009 | Kuwagata et al. |
| 2009/0160490 A1 | 6/2009 | Choi et al. |
| 2014/0313066 A1 | 10/2014 | Dempsey |
| 2016/0049206 A1* | 2/2016 | Huynh ................. H02M 3/158 365/185.21 |
| 2018/0183451 A1 | 6/2018 | Lee et al. |
| 2019/0027224 A1 | 1/2019 | Choo et al. |
| 2019/0279687 A1* | 9/2019 | Lee ..................... G11C 16/225 |
| 2020/0365224 A1* | 11/2020 | Sudo ..................... G11C 29/14 |

\* cited by examiner

VOLTAGE GENERATOR AND MEMORY DEVICE INCLUDING THE SAME

CROSS-REFERENCE TO RELATED APPLICATION(S)

This application claims benefit of priority to Korean Patent Application No. 10-2020-0111051 filed on Sep. 1, 2020 in the Korean Intellectual Property Office, the disclosure of which is incorporated herein by reference in its entirety.

BACKGROUND

Some example embodiments of the present disclosure relate to voltage generators and/or memory devices including the same.

The memory device may provide a function of writing and erasing data, or reading written data. The memory device may include a voltage generator for generating voltages required for operations such as programing, reading, and deleting using power received from an external source. Various methods have been suggested to reduce a circuit area occupied by a voltage generator, to reduce power consumption, and to improve noise properties.

SUMMARY

Some example embodiments of the present disclosure provide voltage generators having a reduced circuit area, reduced power consumption, and improved noise properties, and/or memory devices including the same.

According to an example embodiment of the present disclosure, a memory device may include a memory cell area having a plurality of memory cells, and a peripheral circuit area including peripheral circuits configured to control the memory cells, the peripheral circuits connected to the memory cells by at least a portion of bit lines, word lines, and select lines, wherein the peripheral circuits include a row decoder connected to the memory cells by the word lines and the select lines, a page buffer connected to the memory cells by the bit lines, a control logic configured to control the row decoder and the page buffer, and a reference voltage generator configured to output at least one reference voltage in response to control data of the control logic, and wherein the reference voltage generator includes a first resistor chain including first resistors connected in series between a first power node and a second power node, a second resistor chain including second resistors connected in series between the first power node and the second power node, and a plurality of decoders connected to the first resistor chain and the second resistor chain.

According to an example embodiment of the present disclosure, a voltage generator may include a band-gap reference circuit configured to generate a bias voltage, a low-dropout regulator (LDO) regulator configured to generate a first power voltage and a second power voltage, based on the bias voltage, and a reference voltage generator including a first resistor chain including first resistors connected between the first power voltage and the second power voltage, a second resistor chain including second resistors connected between the first power voltage and the second power voltage, and a plurality of decoders connected to at least one of the first resistor chain and the second resistor chain and configured to output reference voltages, wherein the reference voltage generator is configured such that, in a standby mode, a first standby current flows in the first resistor chain, and a second standby current, which is lower than the first standby current, flows in the second resistor chain, and in an active mode, a first operating current flows in the first resistor chain and a second operating current, larger than the first operating current, flows in the second resistor chain.

According to an example embodiment of the present disclosure, a memory device may include a memory cell area having first pads, and a peripheral circuit area having second pads, and connected to the memory cell area by coupling the first pads and the second pads in a first direction, wherein the peripheral circuit area further includes a row decoder connected to memory cells in the memory cell area by word lines and select lines, a page buffer connected to the memory cells by bit lines, a control logic configured to control the row decoder and the page buffer, and a voltage generator configured to output reference voltages in response to a control command of the control logic, wherein the voltage generator includes a first resistor chain having first resistors connected to each other in series and a first power switch, a second resistor chain having second resistors connected to each other in series and a second power switch, and a plurality of decoders connected to first intermediate nodes between the first resistors and second intermediate nodes between the second resistors, and wherein the plurality of decoders are connected to each other in parallel and are configured to simultaneously output the reference voltages different from each other.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, some example embodiments of the present disclosure will be described as follows with reference to the accompanying drawings.

Figure 1:
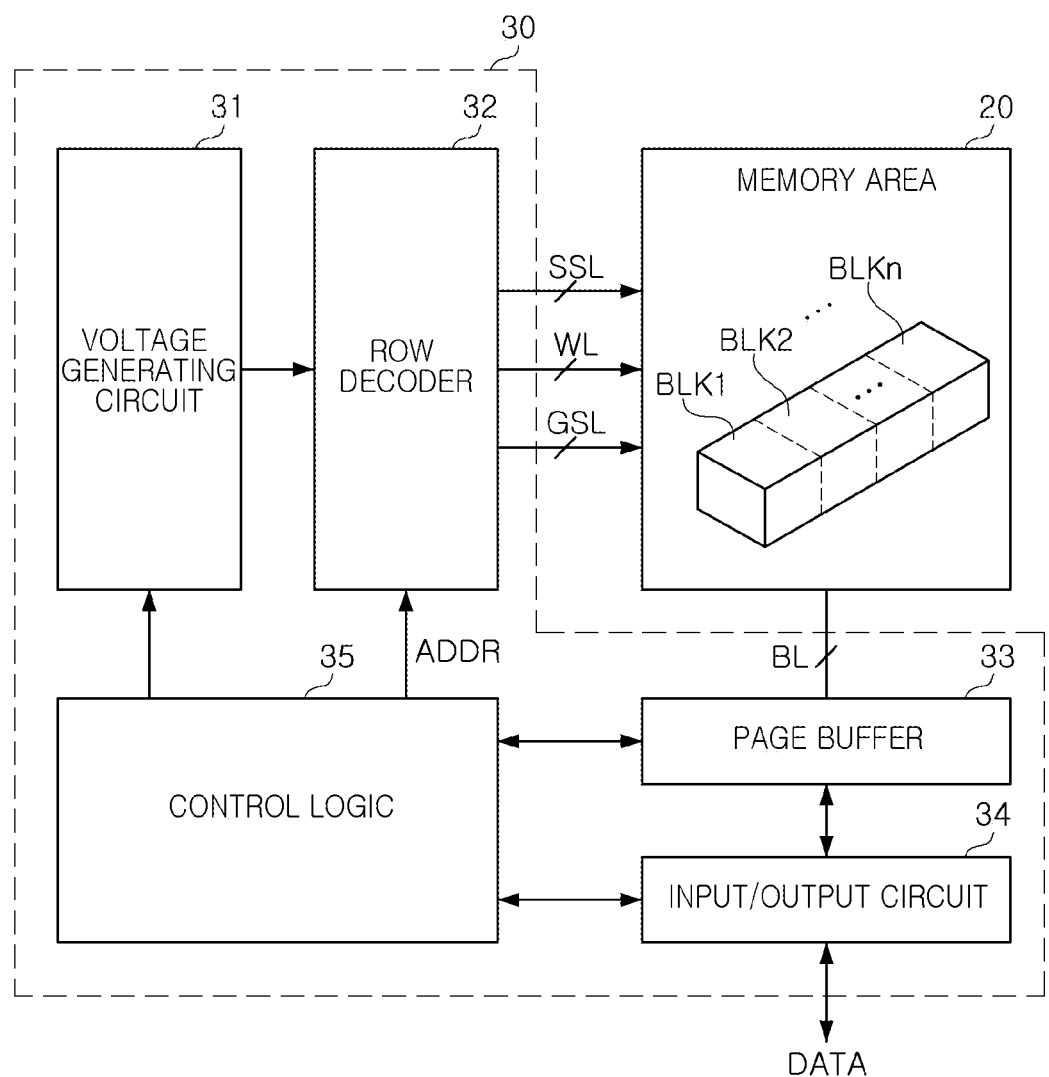
FIGS. 1 and 2 are diagrams illustrating a memory device according to an example embodiment of the present disclosure.
Figure 2:
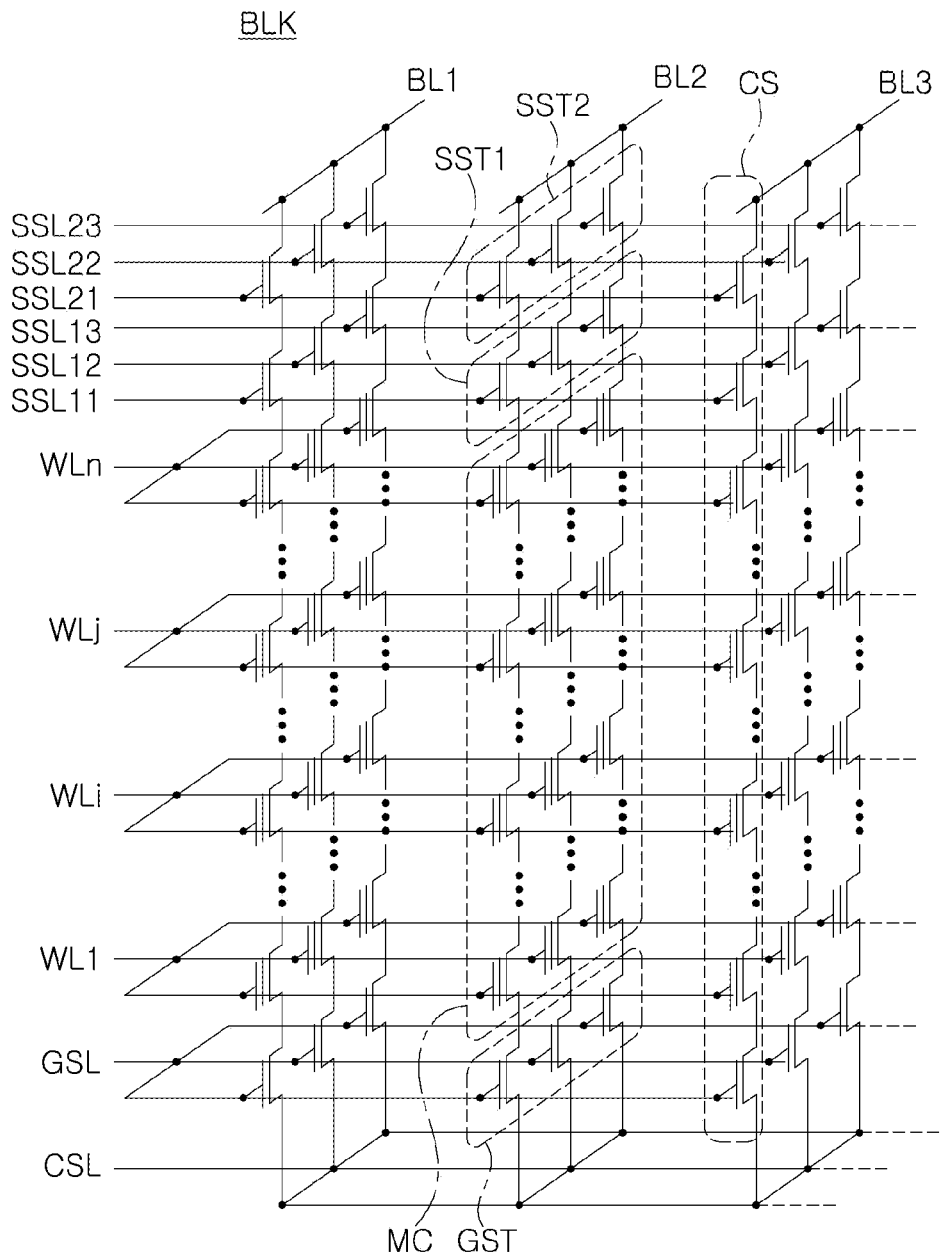

FIGS. 1 and 2 are diagrams illustrating a memory device according to an example embodiment.

Referring to FIG. 1, a memory device 10 may include a memory area 20 and a peripheral circuit 30. The peripheral circuit 30 may include a voltage generator 31, a row decoder 32, a page buffer 33, an input/output circuit 34, and a control logic 35.

The memory area 20 may include a plurality of memory cells, and may be divided into a plurality of blocks BLK1 to BLKn. The plurality of memory cells may be connected to the row decoder 32 by a string select line SSL, word lines WL, and a ground select line GSL, and may be connected to the page buffer 33 by bit lines BL. For example, in each of the blocks BLK1 to BLKn, a plurality of memory cells disposed on the same level from a substrate may be connected to the same word line WL, and a plurality of memory cells disposed in the same position from a plane parallel to an upper surface of the substrate may provide a memory cell string sharing a single channel area. Also, a portion of the memory cell strings included in each of the blocks BLK1 to BLKn may be connected to the same bit line BL.

The row decoder 31 may decode address data ADDR received from the control logic 35, and the like, and may input a voltage desired or required for an operation of the memory device 10 to the word lines WL and the string select line SSL, and the ground select line GSL. For example, the row decoder 32 may input a word line voltage generated by the voltage generator 31 to the word lines WL in response to control of the control logic 35. For example, the row decoder 32 may be connected to the word lines WL by pass transistors, and may input a word line voltage to the word lines WL when the pass transistors are turned on.

The voltage generator 31 may generate a voltage desired or required for operation of the memory device 10. As an example, the voltage generator 31 may include a reference voltage generator for generating reference voltages using power received from an external host. The reference voltage generator may output a plurality of reference voltages having different levels, and a program operation, a read operation, and an erase operation of the memory device 10 may be performed using the reference voltages. Accordingly, to improve operating performance of the memory device 10, the voltage generator 31 may need to stably output the reference voltages.

In an example embodiment, the reference voltage generator may include a resistor chain including a plurality of resistors, and a decoder connected to nodes between the resistors included in the resistor chain. The decoder may include a plurality of switches, and a level of a reference voltage output by the decoder may be determined according to turning-on and turning-off of the switches. As described above, a plurality of reference voltages having different levels may be desired or required for operation of the memory device 10, and to this end, a plurality of decoders may be connected to the resistor chain.

When a plurality of decoders are commonly connected to the resistor chain, an operation of one of the decoders may affect output of the other decoders. To address this issue, a single decoder may be connected to each resistor chain, but in this case, a circuit area occupied by the reference voltage generator and power consumption may increase.

In an example embodiment, a plurality of decoders may be connected to the first resistor chain and the second resistor chain in common, and one of the first resistor chain and the second resistor chain may be supplied with a current only in an active mode in which a reference voltage may need to be actually output. Accordingly, noise properties of the reference voltage generator may be addressed without increasing the circuit area and/or power consumption.

The page buffer 33 may be connected to the memory area 60 by the bit lines BL, and may read data stored in the memory cells or may write data to the memory cells. The page buffer 33 may include a column decoder and a latch circuit. The column decoder may select at least a portion of the bit lines BL of the memory area 20, and the latch circuit may read data from a memory cell connected to the bit line BL selected by the column decoder in a read operation.

The input/output circuit 34 may receive data DATA in a program operation and may transfer the data to the page buffer 33, and may output the data DATA read from the memory area 20 by the page buffer 33 in a read operation. The input/output circuit 34 may transfer an address or a command received from an external memory controller to the control logic 35.

The control logic 35 may control operations of the voltage generator 31, the row decoder 32, the page buffer 63, and the input/output circuit 34. In an example embodiment, the control logic 35 may operate according to a control command transferred from an external memory controller.

Referring to FIG. 2, a single memory block BLK may include a plurality of memory cell strings CS, and at least a portion of the memory cell strings CS may share the word lines WL1 to WLn and/or the bit lines BL1 to BL3.

Each of the memory cell strings CS may include a plurality of memory cells MC connected between the first and second string select transistors SST1 and SST2 and the ground select transistor GST. The first and second string select transistors SST1 and SST2 may be connected to each other in series, and the second string select transistor SST2 disposed in an upper portion may be connected to one of the bit lines BL1 to BL3. The ground select transistor GST may be connected to the common source line CSL. The memory cells MC included in each of the memory cell strings CS may share a single channel area.

The plurality of memory cells MC may be connected in series between the first and second string select transistors SST1 and SST2 and the ground select transistor GST. In example embodiments, the number of each of the string select transistors SST1 and SST2 and the ground select transistor GST may be varied, and each of the memory cell strings CS may further include at least one dummy memory cell. For example, the dummy memory cells may be connected between the first string select transistor SST1 and the memory cells MC, and/or between the ground select transistor GST and the memory cells MC.

Gate electrodes of the plurality of memory cells MC may be connected to the word lines WL1 to WLn. Also, the gate electrode of the ground select transistor GST may be connected to the ground select line GSL, and the gate electrodes of the first and second string select transistors SST1 and SST2 may be connected to the string select lines SSL11 to SSL23.

The ground select line GSL, the word lines WL1 to WLn, and the string select lines SSL11 to SSL23 may be stacked in a first direction perpendicular to the upper surface of the substrate. The ground select line GSL, the word lines WL1 to WLn, and the string select lines SSL11 to SSL23 may be penetrated by a channel structure including a channel area. The channel structure may be connected to one of the bit lines BL1 to BL3.

According to some example embodiments, an erase control transistor (not shown) may be connected to at least one of regions between the ground select transistor GST and the common source line CLS and between the string select transistors SST1 and SST2 and the bit lines BL1-BL3. The erase control transistor may generate a gate induced drain leakage (GIDL) in an erase operation for the memory block BLK.

To execute a program operation, a read operation, and an erase operation, various levels of voltages may be input to the word lines WL, the ground select line GSL, the string select lines SSL11 to SSL23, the common source line CSL, and the bit lines BL1 to BL3. For example, in the program operation, a high program voltage may be input to the word line WL connected to the selected memory cell to which data is to be written, and a voltage lower than the program voltage may be input to the word lines WL connected to non-selected memory cells. Also, in a read operation, a desired (or alternatively, predetermined) read voltage may be input to a word line WL connected to a selected memory cell from which data is to be read, and a pass voltage may be input to the word lines WL connected to the non-selected memory cells.

Voltages of various levels desired or required for operation as described above may be generated from voltages output by the voltage generator. To stably provide desired or required voltages of various levels according to operation, the voltage generator in an example embodiment may include a first resistor chain supplied with a current in both an active mode and a standby mode, and a second resistor chain supplied with a current only in the active mode. Accordingly, in the active mode, an effect of output of one of the decoders connected to the first resistor chain and the second resistor chain on output of the other decoders may be reduced, and kickback noise may be reduced.

Figure 3:
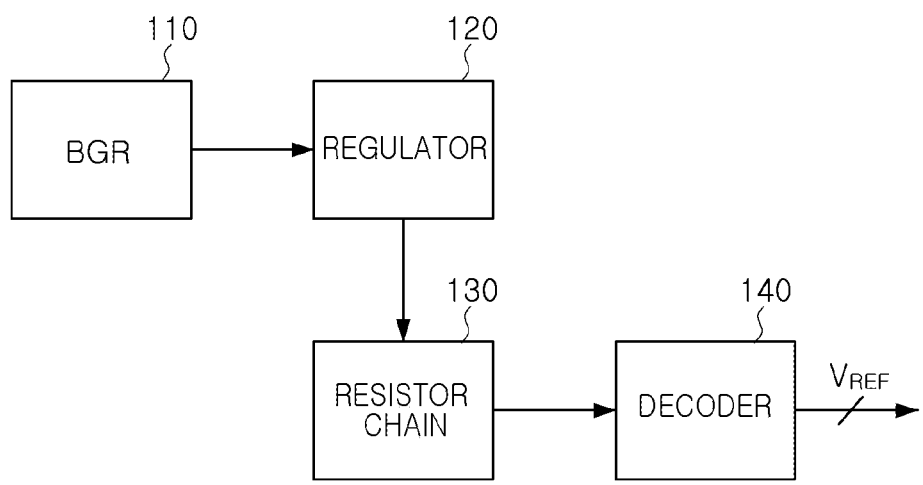
FIG. 3 is a diagram illustrating a voltage generator according to an example embodiment of the present disclosure.

FIG. 3 is a diagram illustrating a voltage generator according to an example embodiment.

Referring to FIG. 3, a voltage generator 100 in an example embodiment may include a band gap reference circuit (BGR) 110, a regulator 120, a resistor chain 130, and a decoder 140. In an example embodiment, the BGR 110 may include at least one bipolar junction transistor (BJT), which is configured to operate by receiving external power, and may compensate for a base-emitter voltage and a threshold voltage of the bipolar junction transistor according to temperature changes, thereby outputting a constant current and/or voltage.

The regulator 120 may include an amplifier, and the amplifier may receive a voltage output by the BGR 110 and may generate a power voltage. The power supply voltage may be transferred to the resistor chain 130. The regulator 120 may be a low-dropout regulator (LDO) regulator.

The resistor chain 130 may include a plurality of resistors connected to each other in series. The plurality of resistors may receive a power voltage output by the regulator 120, and the decoder 140 may be connected to intermediate nodes in which the resistors may be connected to each other. For example, the decoder 140 may include a plurality of switches, and a level of the reference voltage VREF output by the voltage generator 100 may be determined by turning on and off the plurality of switches.

Each of the switches included in the decoder 140 may be turned on and turned off in response to control data. The control data may be determined according to the level of the reference voltage VREF to be output by the decoder 140, and may be generated by the control logic of the semiconductor device including the voltage generator 100.

In an example embodiment, the number of switches included in the decoder 140 may be the same as the number of intermediate nodes included in the resistor chain 130. The control data may be able to control turning on and off of each of the switches. For example, when the number of switches is $2^N$, the control data may be N-bit data.

Figure 4:
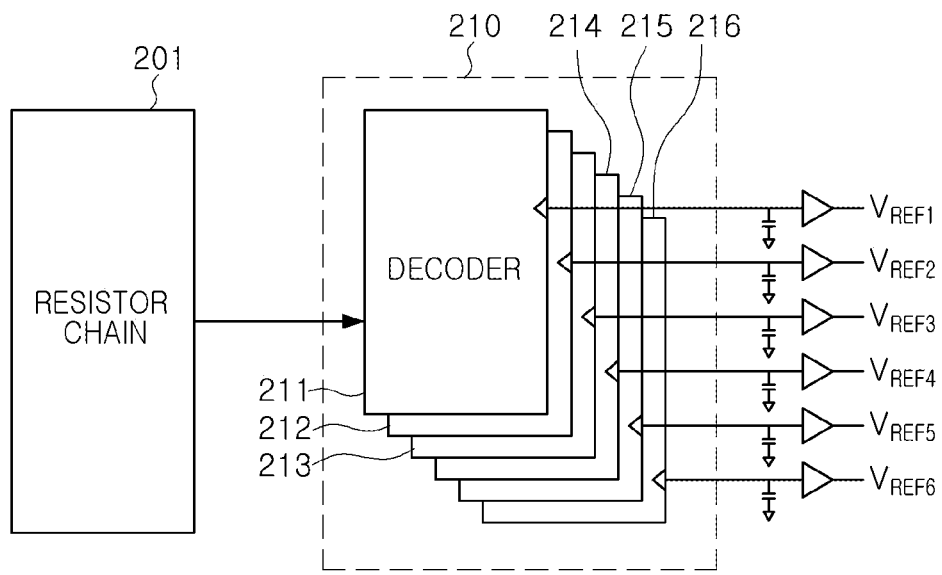
FIGS. 4 to 6 are diagrams illustrating an operation of a voltage generator according to an example embodiment of the present disclosure.
Figure 5:
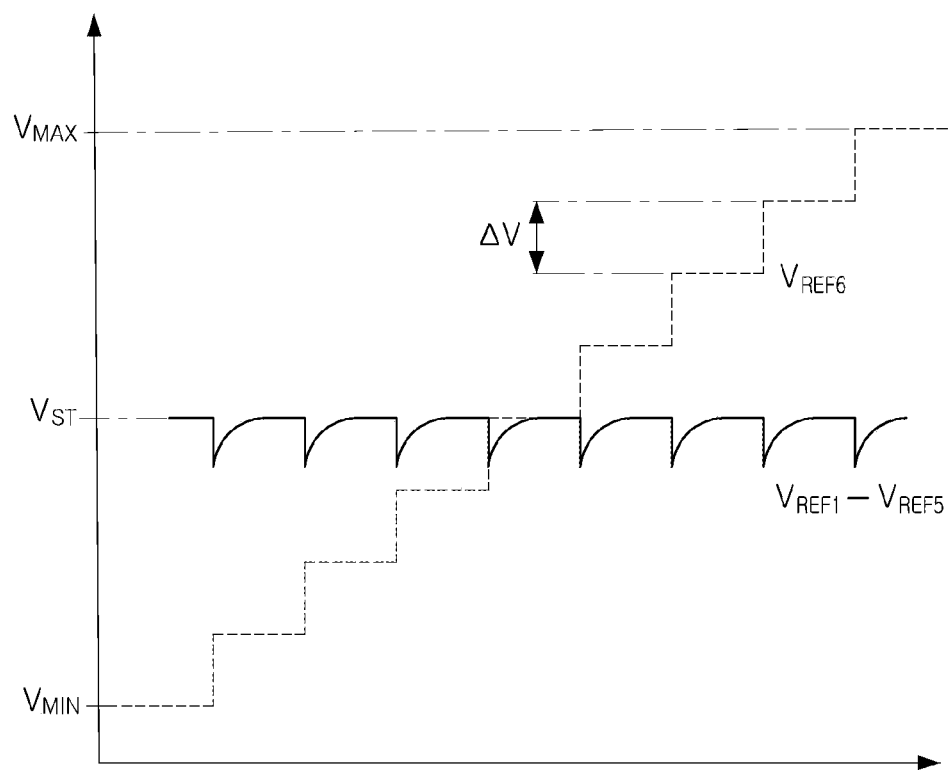
Figure 6:
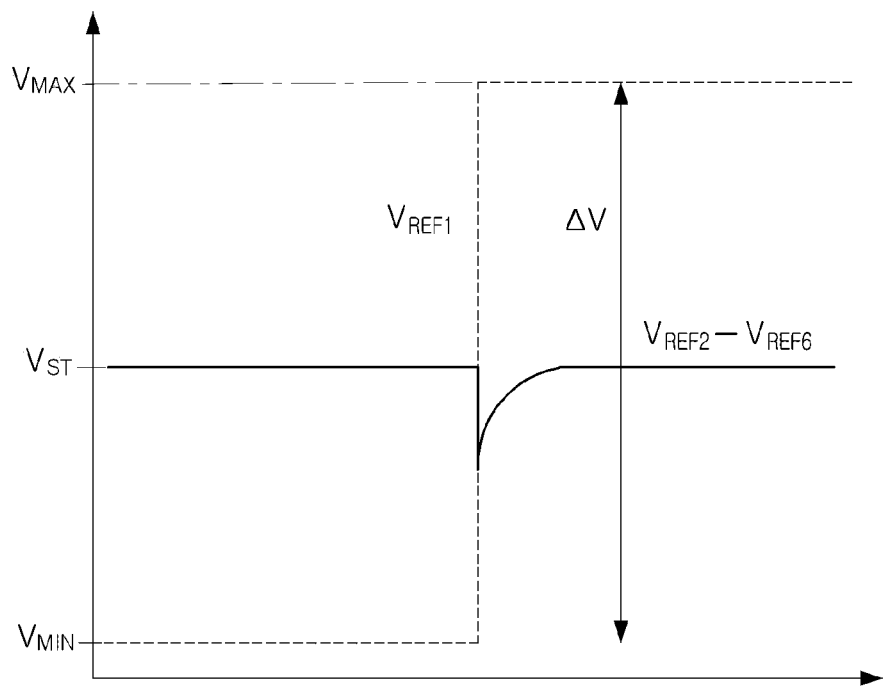

FIGS. 4 to 6 are diagrams illustrating an operation of a voltage generator according to an example embodiment.

Referring to FIG. 4, the voltage generator 200 may include a plurality of decoders 211 to 216 (210) connected to a single resistor chain 201. As described above, the resistor chain 201 may include a plurality of resistors receiving a power voltage and connected to each other in series, and nodes between the plurality of resistors may be defined as intermediate nodes.

A plurality of decoders 210 may be connected to intermediate nodes of the resistor chain 201 in common. Each of the plurality of decoders 210 may include a plurality of switches connected to the intermediate nodes, and reference voltages VREF1 to VREF6 output by the plurality of decoders 210 may be determined by turning on and off the plurality of switches. Output terminals of the plurality of decoders 210 may include a mixer or a differential amplifier for outputting the reference voltages VREF1 to VREF6.

Because the plurality of decoders 210 are connected to the intermediate nodes of the resistor chain 201 in common, a change of at least one of the reference voltages VREF1 to VREF6 may affect the other reference voltages VREF1 to VREF6. For example, when the level of the first reference voltage VREF1 increases or decreases by the first decoder 211, the levels of the remaining reference voltages VREF2 to VREF6 may unintentionally change. For example, when the level of the first reference voltage VREF1 increases or decreases, the level of the remaining reference voltages VREF2 to VREF6 momentarily increases or decreases, and returns to the original level. This change may work as a noise element on the reference voltages VREF1 to VREF6 output by the voltage generator 200 and may deteriorate the operating performance of the voltage generator 200 and a semiconductor device including the same.

FIGS. 5 and 6 are graphs illustrating an effect of an output change of at least one of the plurality of decoders 210 on the remaining decoders 210. Referring to FIG. 5, while the first to fifth reference voltages VREF1 to VREF5 are maintained at a constant voltage VST, a sixth reference voltage VREF6 may increase from a minimum voltage VMIN to a maximum voltage VMAX gradually. The minimum voltage (VMIN) and the maximum voltage VMAX may be a minimum value and a maximum value of a voltage output by the voltage generator 200, and may be determined according to the level of the power supply voltage supplied to the resistor chain 201 and the level of resistances included in the resistor chain 201.

Referring to FIG. 5, while the sixth reference voltage VREF6 increases from the minimum voltage VMIN to the maximum voltage VMAX, the first to fifth reference voltages VREF6 may momentarily increase at every moment when the sixth reference voltage VREF6 increases and may return to the original voltage VST. In other words, whenever turning on and off of the plurality of switches included in the sixth decoder 216 changes and the level of the sixth reference voltage VREF6 changes, the levels of the first to fifth reference voltages VREF1 to VREF5 output by the first to fifth decoders 211 to 215, which are connected to the resistor chain 201 in common with the sixth decoder 216 may unintentionally change.

In an example embodiment illustrated in FIG. 6, the sixth reference voltage VREF6 output by the sixth decoder 216 may increase from the minimum voltage VMIN to the maximum voltage VMAX at once. Similarly to the example described with reference to FIG. 5, the levels of the first to fifth reference voltages VREF1 to VREF5 may change at the time when the sixth reference voltage VREF6 increases. The level change of the first to fifth reference voltages VREF1 to VREF5 may be greater than the example described with reference to FIG. 5.

As described above, as the resistor chain 201 is shared by the plurality of decoders 210, a change in the output of one of the plurality of decoders 210 may affect the output of the other decoders 210 as noise. In an example embodiment, by increasing the number of resistor chains 201 connected to the plurality of decoders 210 in common, the influence between the plurality of decoders 210 may be reduced. By increasing the number of resistor chains 201, the level of the current flowing in the resistor chain 201 and the plurality of decoders 210 may increase. Accordingly, when the output of one of the plurality of decoders 210 changes, the outputs of the other decoders 210 may swiftly return to the original level, and the influence of noise may be reduced. Such an example embodiment will be described in greater detail with reference to FIGS. 7 to 9.

Figure 7:
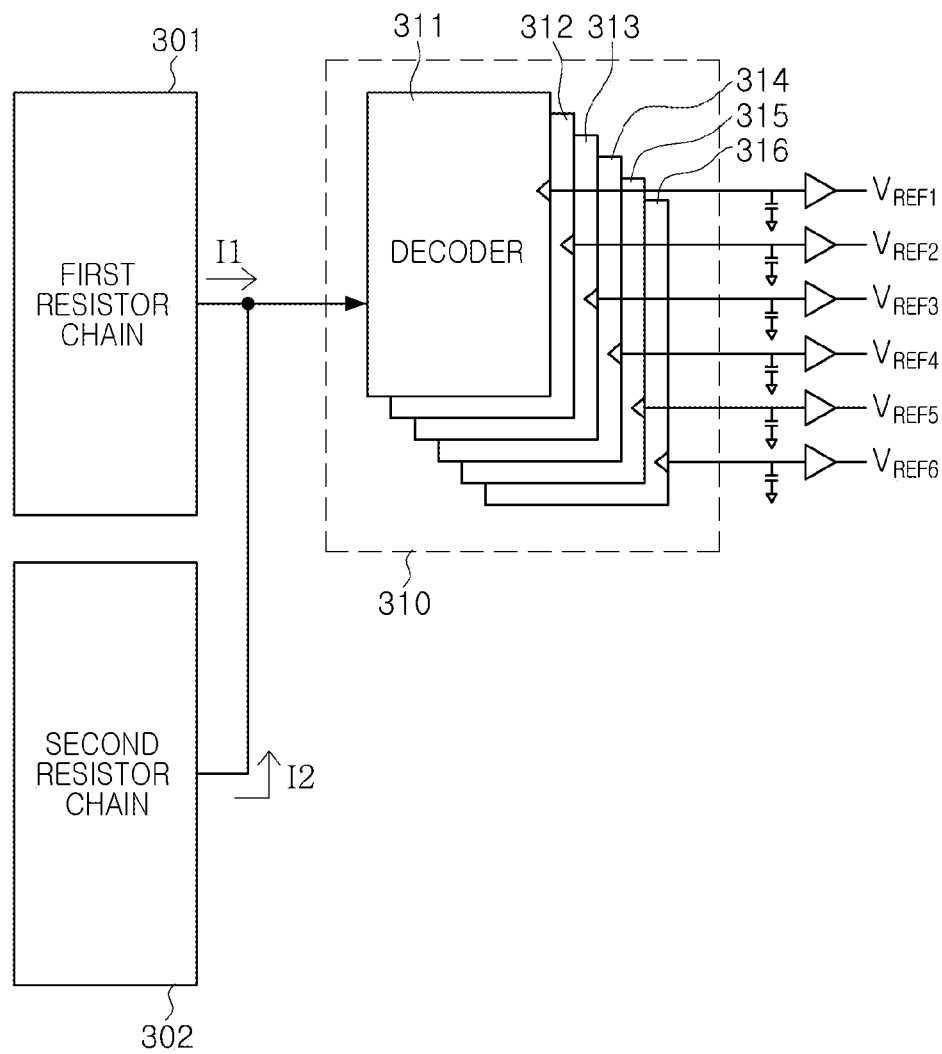
FIGS. 7 to 9 are diagrams illustrating an operation of a voltage generator according to an example embodiment of the present disclosure.
Figure 8:
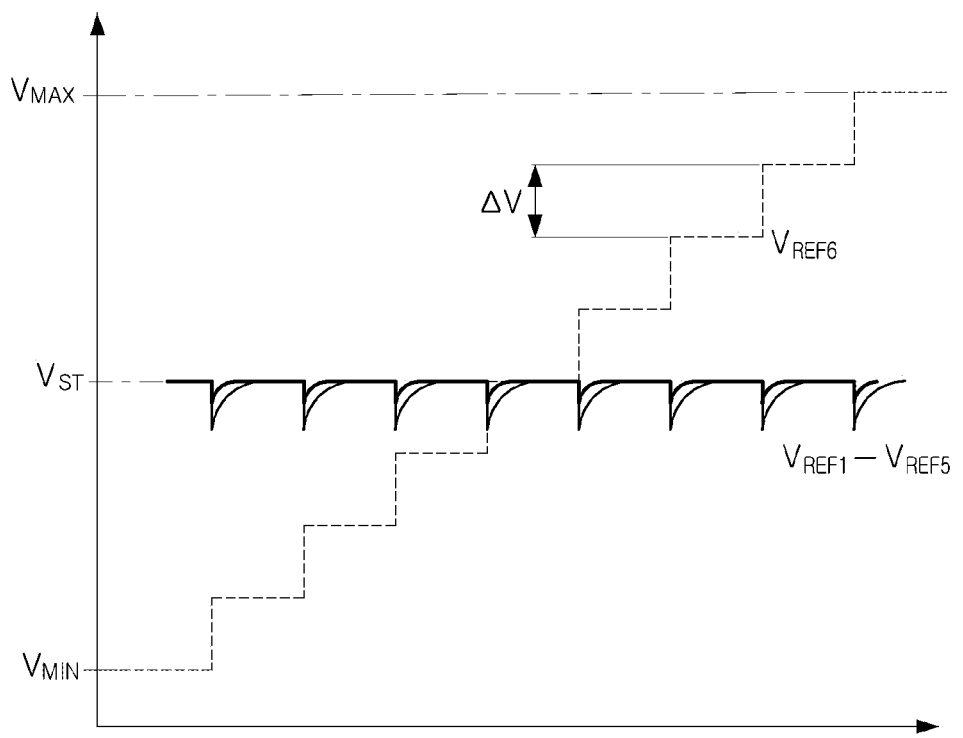
Figure 9:
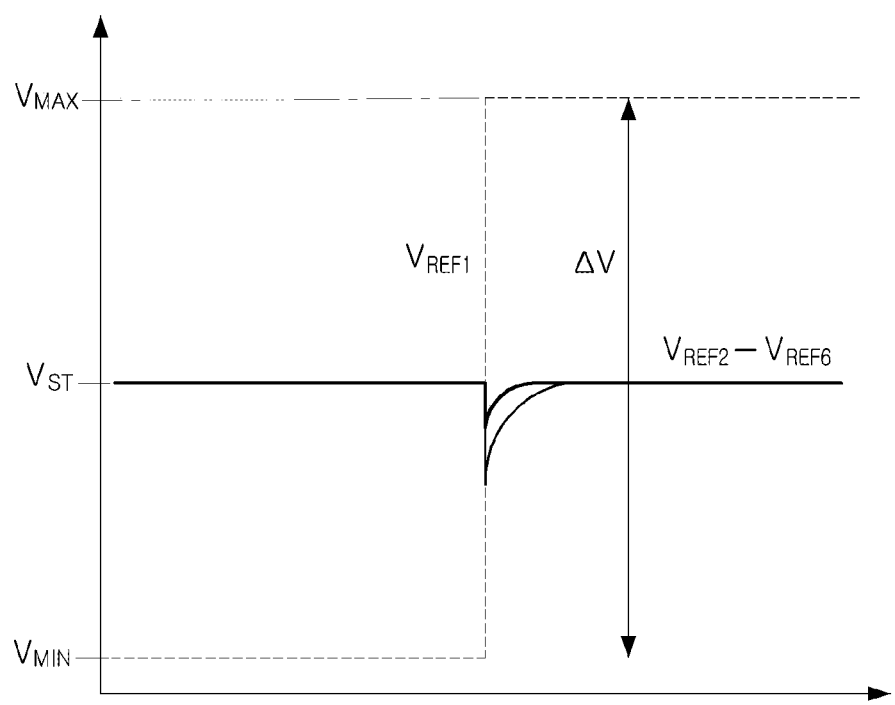

FIGS. 7 to 9 are diagrams illustrating an operation of a voltage generator according to an example embodiment.

Referring to FIG. 7, a voltage generator 300 in an example embodiment may include a first resistor chain 301, a second resistor chain 302, and a plurality of decoders 311 to 316 (310). The number of the plurality of decoders 310 may not be limited to the example illustrated in FIG. 7 and may be varied. The plurality of decoders 310 may be connected to the first resistor chain 301 and the second resistor chain 302 in common.

Each of the first resistor chain 301 and the second resistor chain 302 may include a plurality of resistors. As an example, the first resistor chain 301 may include a plurality of first resistors connected in series between a first power node and a second power node, and the second resistor chain 302 may include a plurality of second resistors connected in series between the first power node and the second power node. The first resistors may have the same resistance value, and the second resistors may have the same resistance value. According to some example embodiments, a resistance value of each of the first resistors may be equal to a resistance value of each of the second resistors or may be greater than a resistance value of each of the second resistors.

The first resistor chain 301 may include a plurality of first intermediate nodes in which first resistors may be connected to each other, and the second resistor chain 302 may include a plurality of second intermediate nodes in which the second resistors may be connected to each other. The first intermediate nodes and the second intermediate nodes may be connected to the plurality of decoders 310, and the first intermediate nodes and the second intermediate nodes may be connected to each other in some example embodiments. For example, the first intermediate nodes and the second intermediate nodes may be connected to each other by connection wirings or may be connected to each other by connection switches. A connection structure between the first resistor chain 301 and the second resistor chain 302 will be described later.

In an example embodiment, the voltage generator 300 may operate differently in a standby mode and an active mode. A first current I1 may be applied to the first resistor chain 301 in both the standby mode and the active mode. A second current I2 may be applied to the second resistor chain 302 only in the active mode. The levels of each of the first current I1 and the second current I2 may be determined according to resistance values of the first resistors included in the first resistor chain 301 and resistance values of the second resistors included in the second resistor chain 302. For example, the first current I1 and the second current I2 may be the same, or the second current I2 may be greater than the first current I1.

In the standby mode, the first current I1 may flow only in the first resistor chain 301, such that power consumption of the voltage generator 300 in the standby mode may be reduced. Further, because the first current I1 is continuously applied to the first resistor chain 301 when a mode is switched from the standby mode to the active mode, a desired or required latency may be reduced until the voltage generator 300 outputs the reference voltages.

In an example embodiment, in the active mode, the first current I1 may be applied to the first resistor chain 301 and the second current I2 may be applied to the second resistor chain 302. Accordingly, the current flowing in the plurality of decoders 310 in the active mode may increase as compared to the example embodiment described with reference to FIG. 4, and the effect of a level change of at least one of the reference voltages VREF1 to VREF6 on the other reference voltages VREF1 to VREF6 may be reduced.

As illustrated in FIG. 7, a mixer (not shown) or an amplifier (not shown) for outputting the reference voltages VREF1 to VREF6 may be connected to the output terminals of each of the decoders 311 to 316. Because parasitic capacitance is present on the input terminal of the mixer or the amplifier, and the decoders 311 to 316 share the first resistor chain 301 and the second resistor chain 302, a level change of at least one of the reference voltages VREF1 to VREF6 may affect to the other reference voltages VREF1 to VREF6 through the parasitic capacitance. In an example embodiment, because the first current I1 and the second current I2 are input to the decoders 311 to 316 in the active mode, the effect of the level of at least one of the reference voltages VREF1 to VREF6 on the other reference voltages VREF1 to VREF6 may be reduced. Further, even when the level of the rest of the reference voltages VREF1 to VREF6 changes due to a change in the level of at least one of the reference voltages VREF1 to VREF6, the original voltage may be swiftly recovered because the current flowing in the plurality of decoders 310 increases.

FIGS. 8 and 9 are graphs illustrating an effect of an output change of at least one of the plurality of decoders on the other decoders. In FIGS. 8 and 9, a thick solid line may correspond to the output of the voltage generator 300 including the first resistor chain 301 and the second resistor chain 302 as in the example embodiment illustrated in FIG. 7, and the thin solid line may correspond to the output of the voltage generator 200 including one resistor chain 201 as in the example embodiment illustrated in FIG. 4.

Referring first to FIG. 8, while the first to fifth reference voltages VREF1 to VREF5 are maintained at a constant voltage VST, the sixth reference voltage VREF6 may increase from the minimum voltage VMIN to the maximum voltage VMAX. In the voltage generator 300 according to the example embodiment illustrated in FIG. 7, the second current I2 flowing in the second resistor chain 302 may be applied to the plurality of decoders 310 in addition to the first current I1 flowing in the first resistor chain 301. Accordingly, the voltage change of the first to fifth reference voltages VREF1 to VREF5 may appear relatively small at the time when the sixth reference voltage VREF6 increases, and the time for which the first to fifth reference voltages VREF1 to VREF5 return to the original voltage VST may also be reduced. Further, in an example embodiment illustrated in FIG. 9, due to the influence of the second current I2 added to the first current I1, the voltage changes of the first to fifth reference voltages VREF1 to VREF5 may be relatively small when the sixth reference voltage VREF6 increases from the minimum voltage VMIN to the maximum voltage VMAX at once, and the time for which the first to fifth reference voltages VREF1 to VREF5 return to the original voltage VST may be reduced FIGS. 10 and 11 are diagrams illustrating a voltage generator according to an example embodiment.

Figure 10:
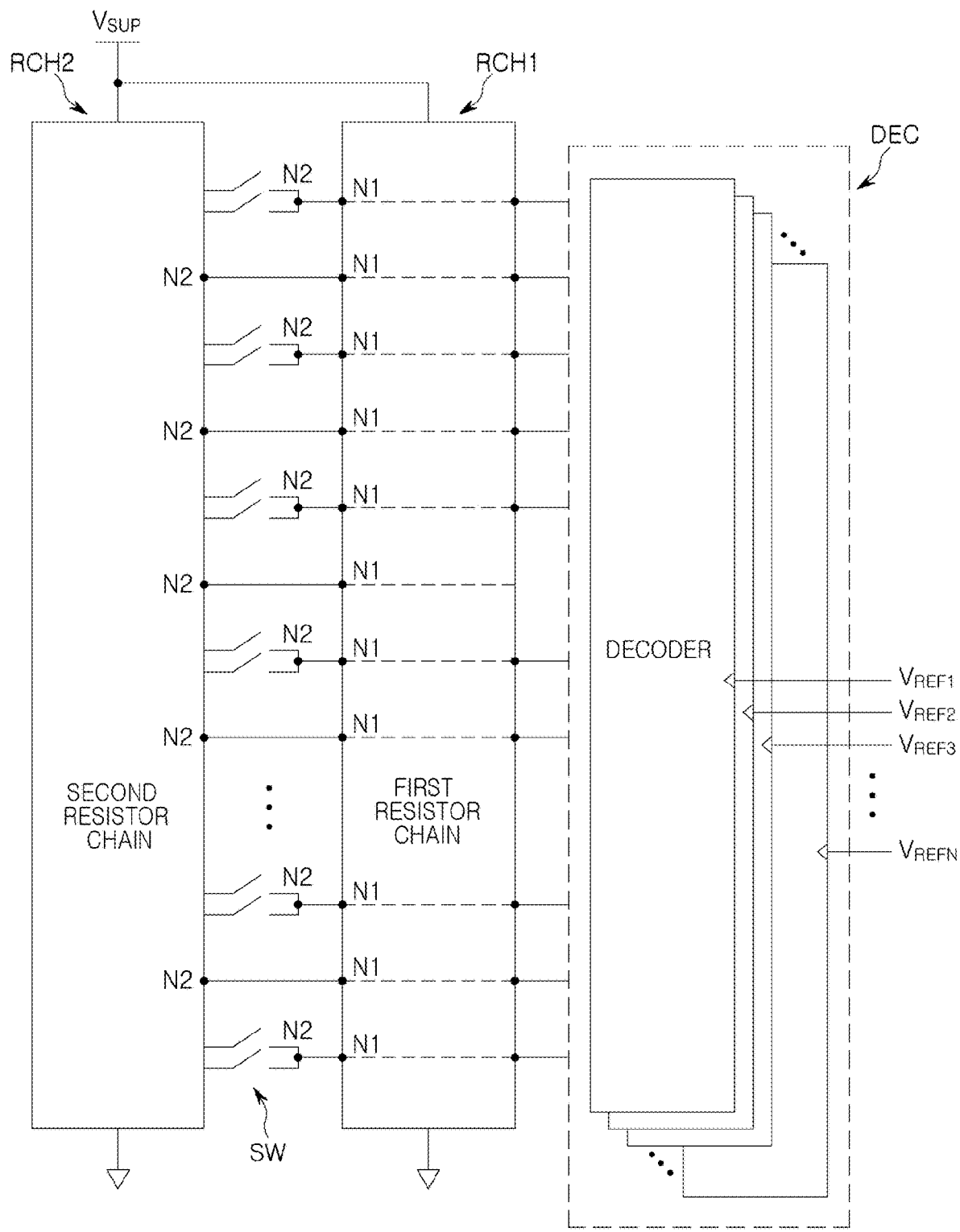
FIGS. 10 and 11 are diagrams illustrating a voltage generator according to an example embodiment of the present disclosure.
Figure 11:
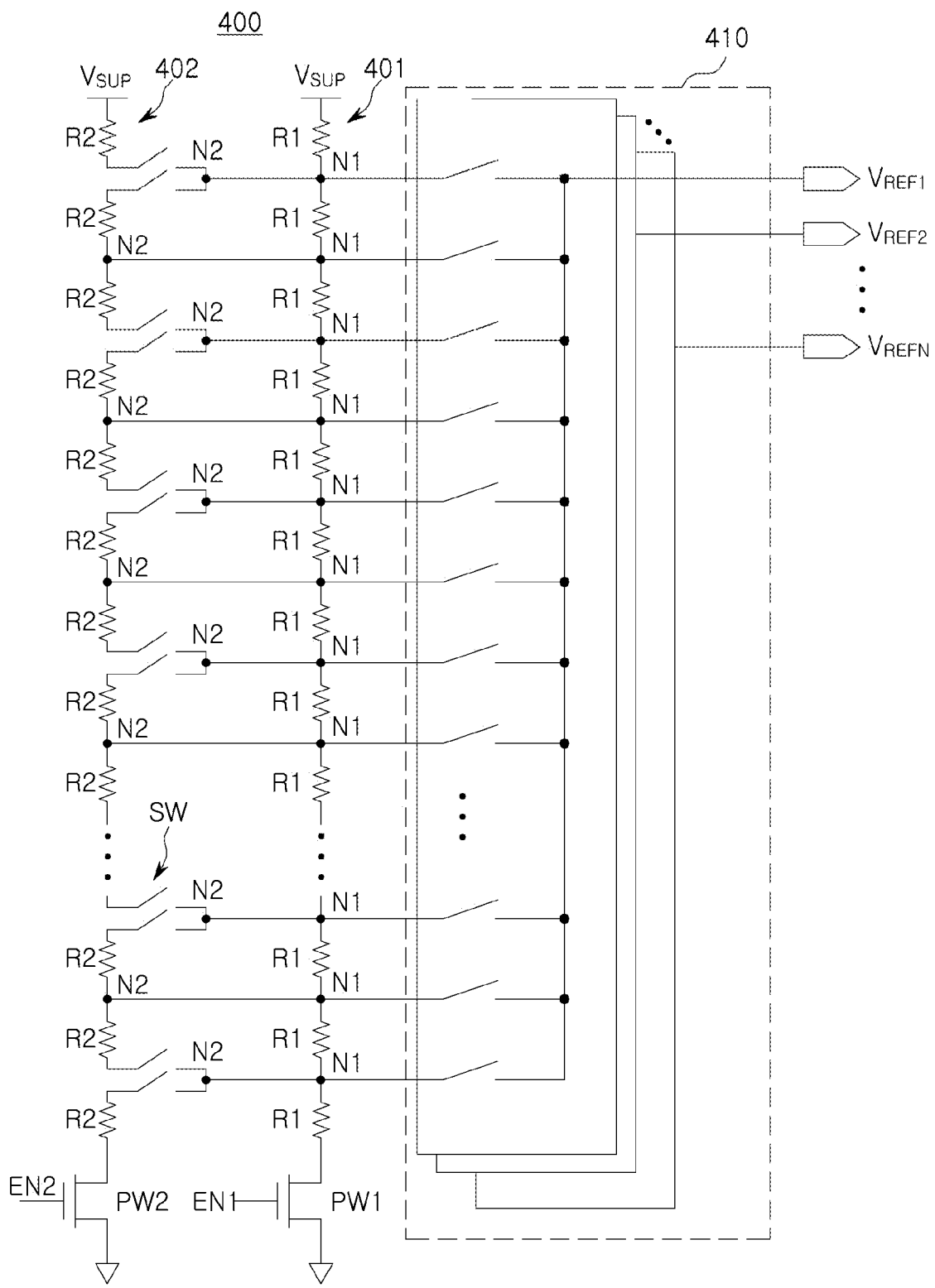

Referring to FIG. 10, a voltage generator according to an example embodiment may include a first resistor chain RCH1, a second resistor chain RCH2, and a decoder portion DEC. The first resistor chain RCH1 may include a first power node for supplying a first power voltage VSUP, and a plurality of first resistors connected to each other in series between the second power nodes for supplying a second power voltage lower than the first power voltage VSUP, such as a ground voltage. Similarly, the second resistor chain RCH2 may include a plurality of second resistors R2 connected in series between the first power node and the second power node.

The first resistor chain RCH1 may include first intermediate nodes N1 in which a plurality of first resistors may be connected to each other. The second resistor chain RCH2 may also include second intermediate nodes N2 in which the plurality of second resistors R2 may be connected to each other. The first intermediate nodes N1 and the second intermediate nodes N2 may be connected to each other by connection lines.

In an example embodiment illustrated in FIG. 10, a portion of the second intermediate nodes N2 may be connected to the second resistors by connection switches SW, and the other second intermediate nodes N2 may be directly connected to the second resistors without the connection switches SW. The second intermediate nodes N2 connected to the second resistors by the connection switches SW may be defined as switching nodes. The second intermediate nodes N2 directly connected to the second resistors without the connection switches SW may be defined as connection nodes. Each of the connection nodes may be a node between a pair of second resistors directly connected to each other. A portion of the connection wires may connect the switching nodes to a portion of the first intermediate nodes N1, and the other connection wires may connect the connection nodes to the other first intermediate nodes N1.

The decoder portion DEC may include a plurality of decoders. The plurality of decoders may output a plurality of reference voltages VREF1 to VREFN having different levels. In an example embodiment, each of the plurality of decoders may include a plurality of switches, and the plurality of switches may be connected to the first intermediate nodes N1. Accordingly, the level of each of the plurality of reference voltages VREF1 to VREFN output by the plurality of decoders may be determined according to turning one and off of each of the plurality of switches.

Referring to FIG. 11, the voltage generator 400 according to an example embodiment may include a first resistor chain 401, a second resistor chain 402 and a decoder 410. The first resistor chain 401 may include a plurality of first resistors R1 connected in series between the first power node and the second power node, and a first power switch PW1 connected between the plurality of first resistors R1 and the second power node. Similarly, the second resistor chain 402 may include a second power switch PW2 connected between a plurality of second resistors R2 and the second power node.

The plurality of first resistors R1 may be connected to each other in the first intermediate nodes N1, and the plurality of second resistors R2 may be connected to each other in the second intermediate nodes N2. The first intermediate nodes N1 and the second intermediate nodes N2 may be connected to each other by connection lines. A portion of the second intermediate nodes N2 may be connected to the connection switches SW, and the other second intermediate nodes N2 may be directly connected to the plurality of second resistors R2 without the connection switches SW.

In an example embodiment, the second intermediate nodes N2 connected to the second resistors R2 by the connection switches SW may be defined as switching nodes. The second intermediate nodes N2 directly connected to the second resistors R2 without the connection switches SW may be defined as connection nodes. A portion of the connection wires may connect the switching nodes to a portion of the first intermediate nodes N1, and the other connection wires may connect the connection nodes to the other first intermediate nodes N1.

The decoder 410 may include a plurality of switches, and the plurality of switches may be connected to first intermediate nodes N1 included in the first resistor chain 401. The level of the reference voltage VREF may be determined according to turning on and off the switches included in the decoder 410. For example, when a switch connected to a node of the first intermediate nodes N1, adjacent to the first power node, is turned on, the level of the reference voltage VREF may increase. When a switch connected to a node of the first intermediate nodes N1, adjacent to the second power node, is turned on, the level of the reference voltage VREF may decrease. In an example embodiment, in an active mode in which the reference voltage VREF is output, only one of the switches included in the decoder 410 may be turned on and the other switches may be turned off.

The voltage generator 400 may operate in a standby mode and an active mode. The standby mode may be an operation mode in which the voltage generator 400 does not output the reference voltage VREF. The active mode may be an operation mode in which the voltage generator 400 outputs the reference voltage VREF in response to control data received from a control logic.

In the standby mode, the first power switch PW1 may be turned on by the first enable signal EN1, and the second power switch PW2 may be turned off by the second enable signal EN2. In the standby mode, a current may only flow in the first resistor chain 401, and accordingly, power consumed by the voltage generator 400 in the standby mode may be reduced.

In the active mode, all connection switches SW connected between at least a portion of the first intermediate nodes N1 and the second intermediate nodes N2 may be turned on, such that the first intermediate nodes N1 may be connected to the second intermediate nodes N2. Also, in the active mode, both the first power switch PW1 and the second power switch PW2 may be turned on.

Accordingly, in the active mode, a current may flow in both the first resistor chain 401 and the second resistor chain 402. For example, a resistance value of each of the plurality of second resistors R2 may be equal to or greater than a resistance value of each of the plurality of first resistors R1. When the resistance value of each of the plurality of second resistors R2 is greater than the resistance value of each of the plurality of first resistors R1, the second current flowing in the second resistor chain R2 in the active mode may be smaller than the first current flowing in the first resistor chain R1.

Accordingly, the first resistor chain 401 and the second resistor chain 402 may be connected to each other in the active mode, and the sum of the first current and the second current may flow in the switch turned on in the decoder 410. Because the first current and also the second current in the standby mode are applied to the decoder 410, when the turning on and off of the switches included in the decoder 410 changes and the reference voltage VREF changes, the effect on the other decoders which share the first resistor chain 401 and the second resistor chain 402 with the decoder 410 may be reduced. Further, the output voltage of the other decoders affected by a change in the reference voltage VREF output by the decoder 401 may swiftly return to the original voltage.

The number of first resistors R1 included in the first resistor chain 401, the number of second resistors R2 included in the second resistor chain 402, and the number of switches included in the decoder 410 may be determined according to levels of the reference voltage VREF to be generated by the voltage generator 400. As an example, when a single decoder 410 needs to output the reference voltage VREF having eight different levels, the decoder 410 may include at least eight switches. In an example embodiment, a resistance value of a resistor directly connected to the first power node in each of the first resistor chain 401 and the second resistor chain 402 and a resistor directly connected to the first power switch PW1 or the second power switch PWM may be determined according to a minimum value and a maximum value of the level of the reference voltage VREF.

FIGS. 12 to 16 are diagrams illustrating voltage generators according to some example embodiments.

Figure 12:
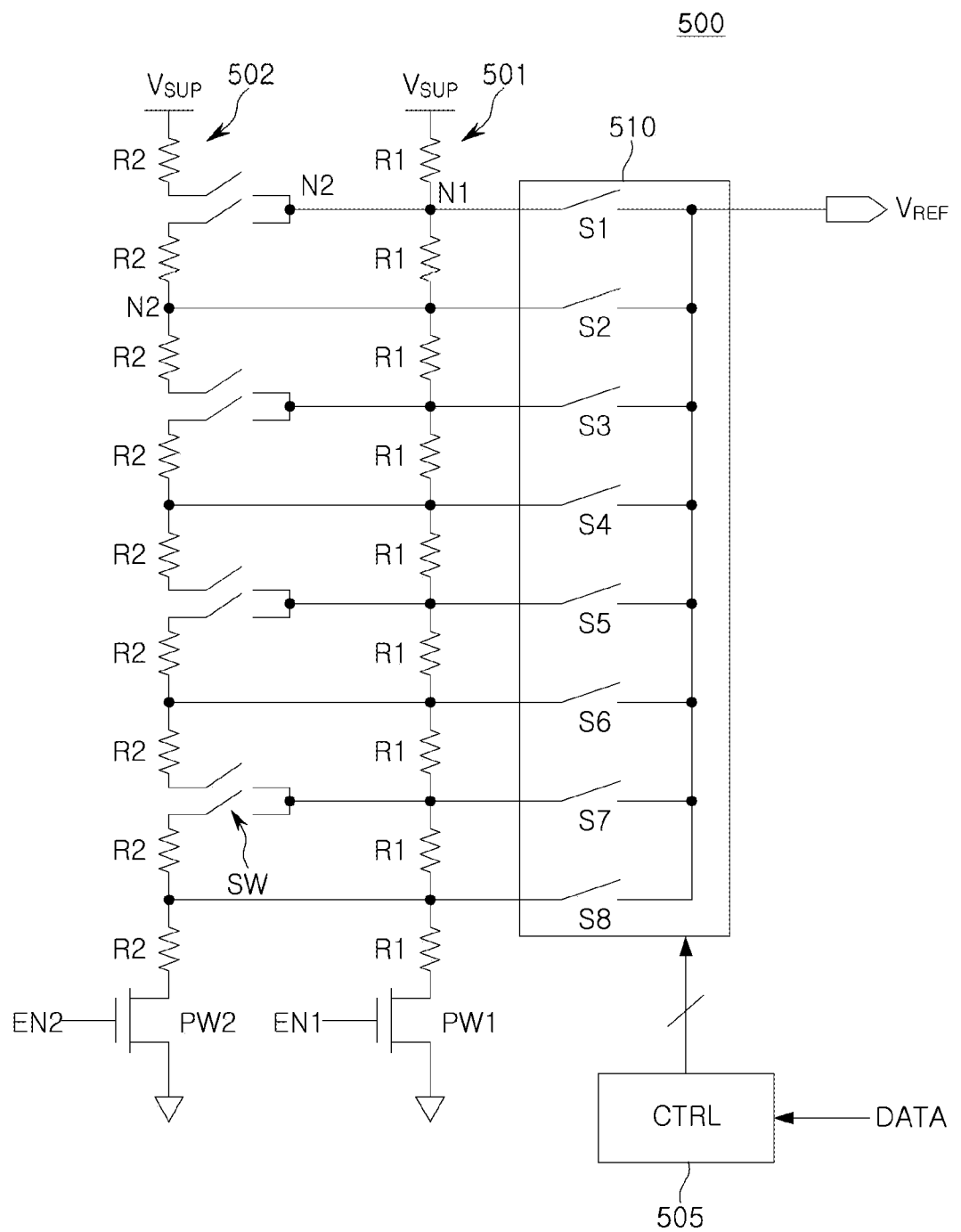
FIGS. 12 to 16 are diagrams illustrating voltage generators according to some example embodiments of the present disclosure.
Figure 13:
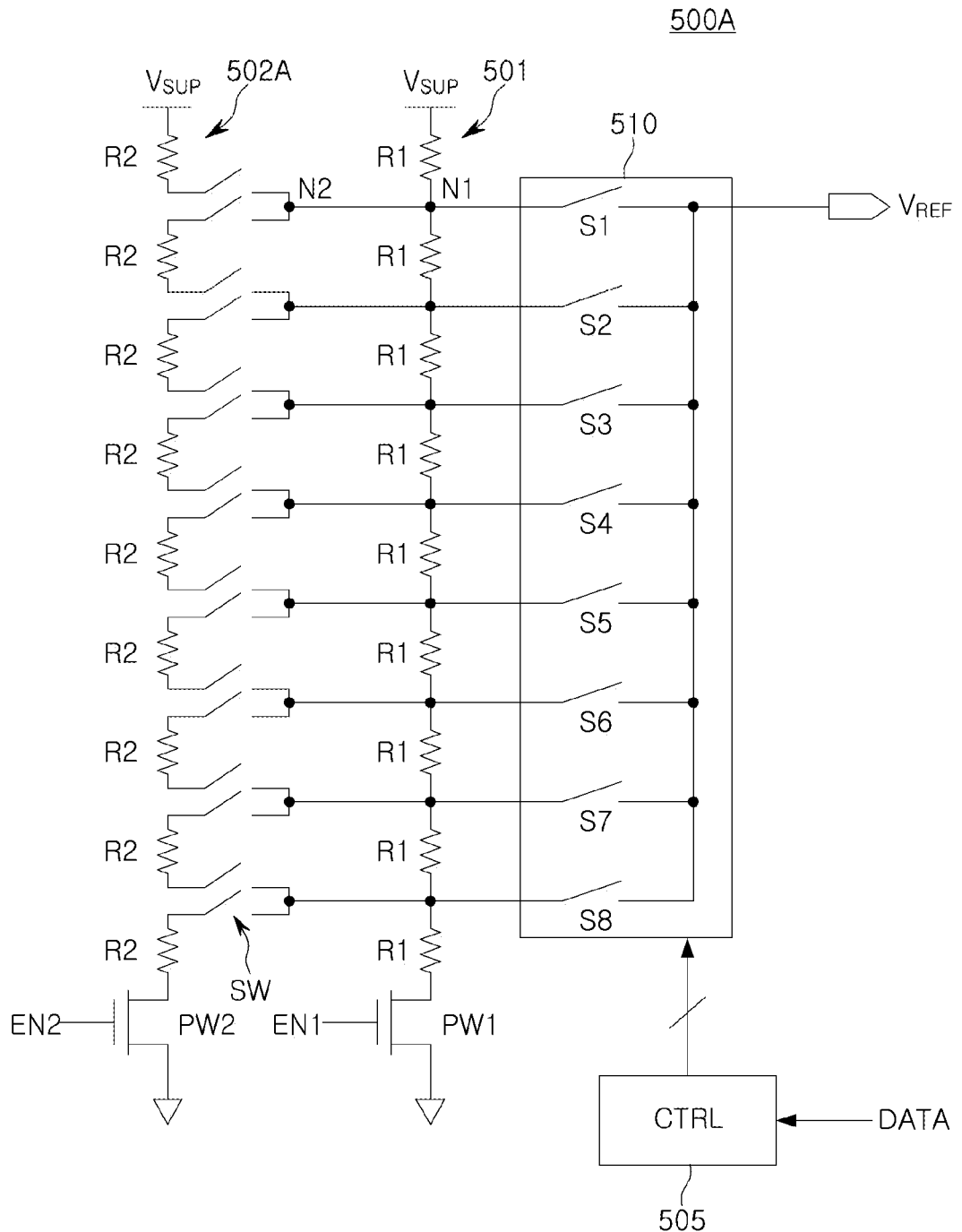

FIGS. 12 and 13 may be diagrams illustrating voltage generators 500 and 500A for generating a reference voltage VREF in response to 3-bit control data DATA. Referring to FIG. 12, the voltage generator 500 may include a first resistor chain 501, a second resistor chain 502, a decoder 510, and a switch controller 505. The switch controller 505 may control turning on and off of switches S1 to S8 included in the decoder 510 according to the 3-bit control data DATA. The switch controller 505 may receive 3-bit control data DATA and may output eight control signals for controlling the switches S1 to S8 to the decoder 510.

The second intermediate nodes N2 of the second resistor chain 502 may be connected to the second resistors R2 by the connection switches SW, or may be directly connected to the second resistors R2. In the example embodiment illustrated in FIG. 12, odd-numbered second intermediate nodes N2 may be connected to the second resistors R2 by the connection switches SW, and even-numbered second intermediate nodes N2 may be directly connected to the second resistors R2. Accordingly, the number of second intermediate nodes N2 may be the same as the number of connection switches SW.

In the standby mode, only the first power switch PW1 may be turned on, and both the second power switch PW2 and the connection switches SW may be turned off. When the semiconductor device including the voltage generator 500 is switched from the standby mode to the active mode, the connection switches SW and the second power switch PW2 may be turned on. The switch controller 505 may determine turning on and off of each of the switches S1 to S8 included in the decoder 510, according to the control data DATA. For example, the control data DATA and the turning on and off of the switches S1 to S8 included in the decoder 510 on and off may be determined as in Table 1 below.

TABLE 1

| DATA | S1 | S2 | S3 | S4 | S5 | S6 | S7 | S8 |
|------|-----|-----|-----|-----|-----|-----|-----|-----|
| 000  | OFF | OFF | OFF | OFF | OFF | OFF | OFF | ON  |
| 001  | OFF | OFF | OFF | OFF | OFF | OFF | ON  | OFF |
| 010  | OFF | OFF | OFF | OFF | OFF | ON  | OFF | OFF |
| 011  | OFF | OFF | OFF | OFF | ON  | OFF | OFF | OFF |
| 100  | OFF | OFF | OFF | ON  | OFF | OFF | OFF | OFF |
| 101  | OFF | OFF | ON  | OFF | OFF | OFF | OFF | OFF |
| 110  | OFF | ON  | OFF | OFF | OFF | OFF | OFF | OFF |
| 111  | ON  | OFF | OFF | OFF | OFF | OFF | OFF | OFF |

Referring to FIG. 13, in the voltage generator 500A, a plurality of second resistors R2 and second intermediate nodes N2 included in the second resistor chain 502A may be connected by connection switches SW. A pair of connection switches SW may be connected to a single second intermediate node N2, and the number of connection switches SW may be greater than the number of second intermediate nodes N2. For example, the number of connection switches SW may be twice the number of second intermediate nodes N2.

The operation of the voltage generator 500A according to the example embodiment illustrated in FIG. 13 may be similar to the voltage generator 500 described with reference to FIG. 12. The switch controller 505 may receive 3-bit control data DATA and may output eight control signals for controlling the switches S1 to S8 to the decoder 510. In the standby mode, only the first power switch PW1 may maintain a turned-on state, and the second power switch PW2 may be turned off. When a mode is switched to the active mode, both the second power switch PW2 and the connection switches SW may be turned on.

Figure 14:
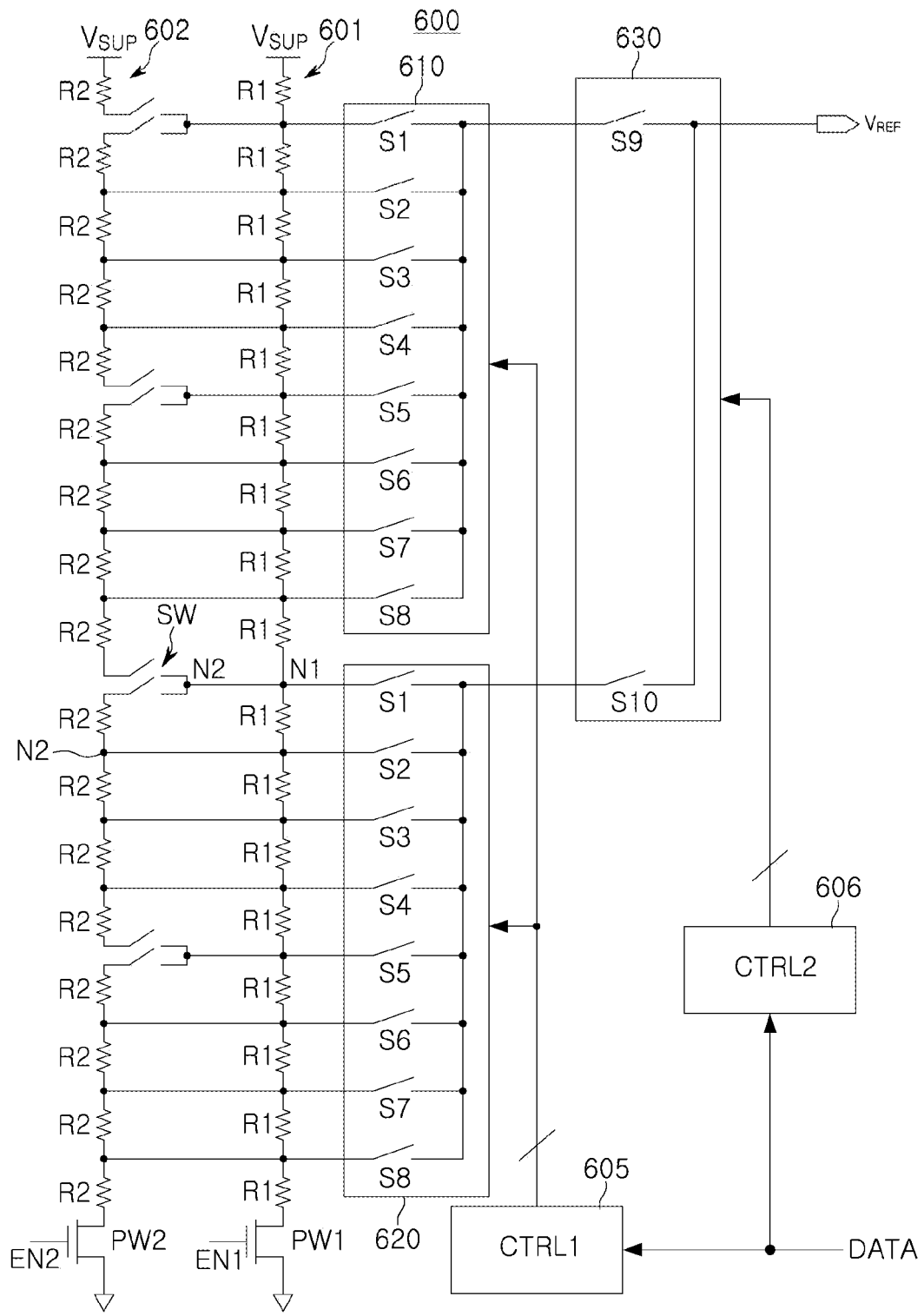

FIG. 14 may be a diagram illustrating a voltage generator 600 for generating a reference voltage VREF in response to 4-bit control data DATA. Referring to FIG. 14, the voltage generator 600 may include a first resistor chain 601, a second resistor chain 602, decoders 610 to 630, and switch controllers 605 and 606. The decoders 610 to 630 include a first sub-decoder 610 and a second sub-decoder 620 connected to the first resistor chain 601 and the second resistor chain 602, and a third sub-decoder 630 connected to the first sub-decoder 610 and the second sub-decoder 620.

The switch controllers 605 and 606 may control turning on and off of the switches S1 to S10 included in the first to third sub-decoders 610 to 630 according to the 4-bit control data DATA. As an example, the switch controllers 605 and 606 may include a first switch controller 605 and a second switch controller 606. In an example embodiment, the first switch controller 605 may receive three lower bits of the control data DATA and may output eight control signals for controlling the switches S1 to S8 included in each of the first and second sub-decoders 610 and 620. The second switch controller 606 may receive a single upper bit from the control data DATA and may output two control signals for controlling the switches S9 and S10 included in the third sub-decoder 630. For example, the control data DATA and the turning the switches S1 to S10 included in the first to third sub-decoders 610 to 630 on and off may be determined as illustrated in Table 2 below.

TABLE 2

| DATA | S1 | S2 | S3 | S4 | S5 | S6 | S7 | S8 | S9 | S10 |
|---|---|---|---|---|---|---|---|---|---|---|
| 0000 | OFF | OFF | OFF | OFF | OFF | OFF | OFF | ON | OFF | ON |
| 0001 | OFF | OFF | OFF | OFF | OFF | OFF | ON | OFF | OFF | ON |
| 0010 | OFF | OFF | OFF | OFF | OFF | ON | OFF | OFF | OFF | ON |
| 0011 | OFF | OFF | OFF | OFF | ON | OFF | OFF | OFF | OFF | ON |
| 0100 | OFF | OFF | OFF | ON | OFF | OFF | OFF | OFF | OFF | ON |
| 0101 | OFF | OFF | ON | OFF | OFF | OFF | OFF | OFF | OFF | ON |
| 0110 | OFF | ON | OFF | OFF | OFF | OFF | OFF | OFF | OFF | ON |
| 0111 | ON | OFF | OFF | OFF | OFF | OFF | OFF | OFF | OFF | ON |
| 1000 | OFF | OFF | OFF | OFF | OFF | OFF | OFF | ON | ON | OFF |
| 1001 | OFF | OFF | OFF | OFF | OFF | OFF | ON | OFF | ON | OFF |
| 1010 | OFF | OFF | OFF | OFF | OFF | ON | OFF | OFF | ON | OFF |
| 1011 | OFF | OFF | OFF | OFF | ON | OFF | OFF | OFF | ON | OFF |
| 1100 | OFF | OFF | OFF | ON | OFF | OFF | OFF | OFF | ON | OFF |
| 1101 | OFF | OFF | ON | OFF | OFF | OFF | OFF | OFF | ON | OFF |
| 1110 | OFF | ON | OFF | OFF | OFF | OFF | OFF | OFF | ON | OFF |
| 1111 | ON | OFF | OFF | OFF | OFF | OFF | OFF | OFF | ON | OFF |

Referring to Table 2, when an uppermost bit of the control data DATA is 1, the ninth switch S9 of the third sub-decoder 630 may be turned on and the tenth switch S10 may be turned off. When an uppermost bit of the control data DATA is 0, the ninth switch S9 of the third sub-decoder 630 may be turned off and the tenth switch S10 may be turned on. The switches S1 to S8 included in each of the first sub-decoder 610 and the second sub-decoder 620 may be simultaneously controlled by eight control signals provided by the first switch controller 605. In other words, when the first switch S1 is turned on and the other switches S2 to S8 are turned off in the first sub-decoder 610, the first switch S1 may also be turned on and the other switches S2 to S8 may be turned off in the second sub-decoder 620.

As an example, when the control data DATA is [0011], the fifth switch S5 may be turned on and the other switches S1 to S4 and S6 to S8 may be turned off in each of the first sub-decoder 610 and the second sub-decoder 620. Further, as an uppermost bit of the control data DATA is 0, the ninth switch S9 may be turned off and the tenth switch S10 may be turned on. When the control data DATA is [1011], the fifth switch S5 may be turned on in each of the first sub-decoder 610 and the second sub-decoder 620, and the ninth switch S9 may be turned on in the third sub-decoder 630.

The second intermediate nodes N2 may be connected to the second resistors R2 by the connection switches SW, or may be directly connected to the second resistors R2. In the example embodiment illustrated in FIGS. 15 and 16, one of the four second intermediate nodes N2 may be connected to the second resistors R2 by the connection switches SW. Accordingly, the number of second intermediate nodes N2 may be greater than the number of connection switches SW.

The arrangement of the connection switches SW may be varied in some example embodiments. For example, as described above with reference to FIG. 12, odd-numbered second intermediate nodes N2 may be connected to connection switches SW, and even-numbered second intermediate nodes N2 may be directly connected to the second resistors R2. In some example embodiments, as described with reference to FIG. 13, all the second intermediate nodes N2 may be connected to the second resistors R2 by the connection switches SW.

Figure 15:
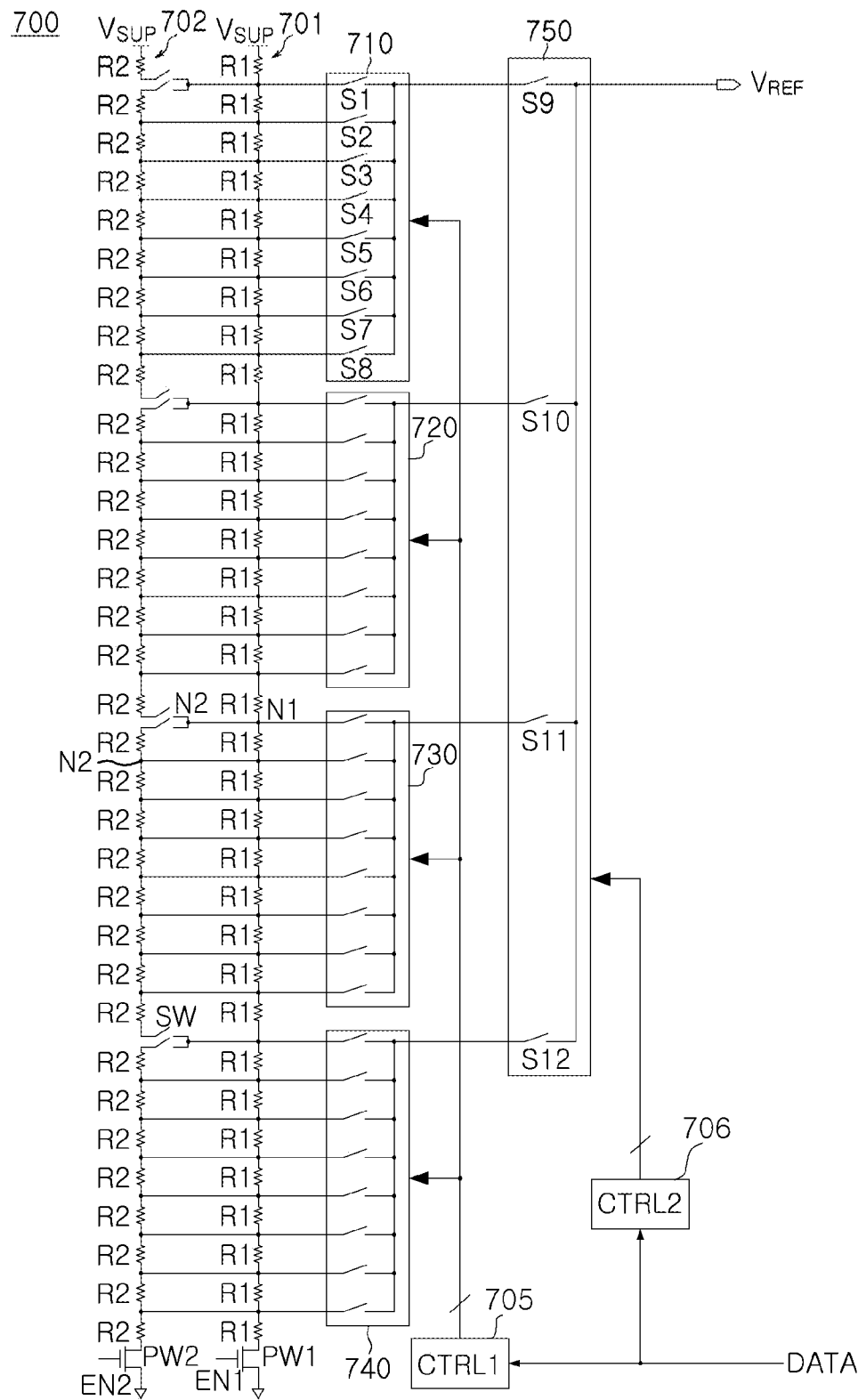
Figure 16:
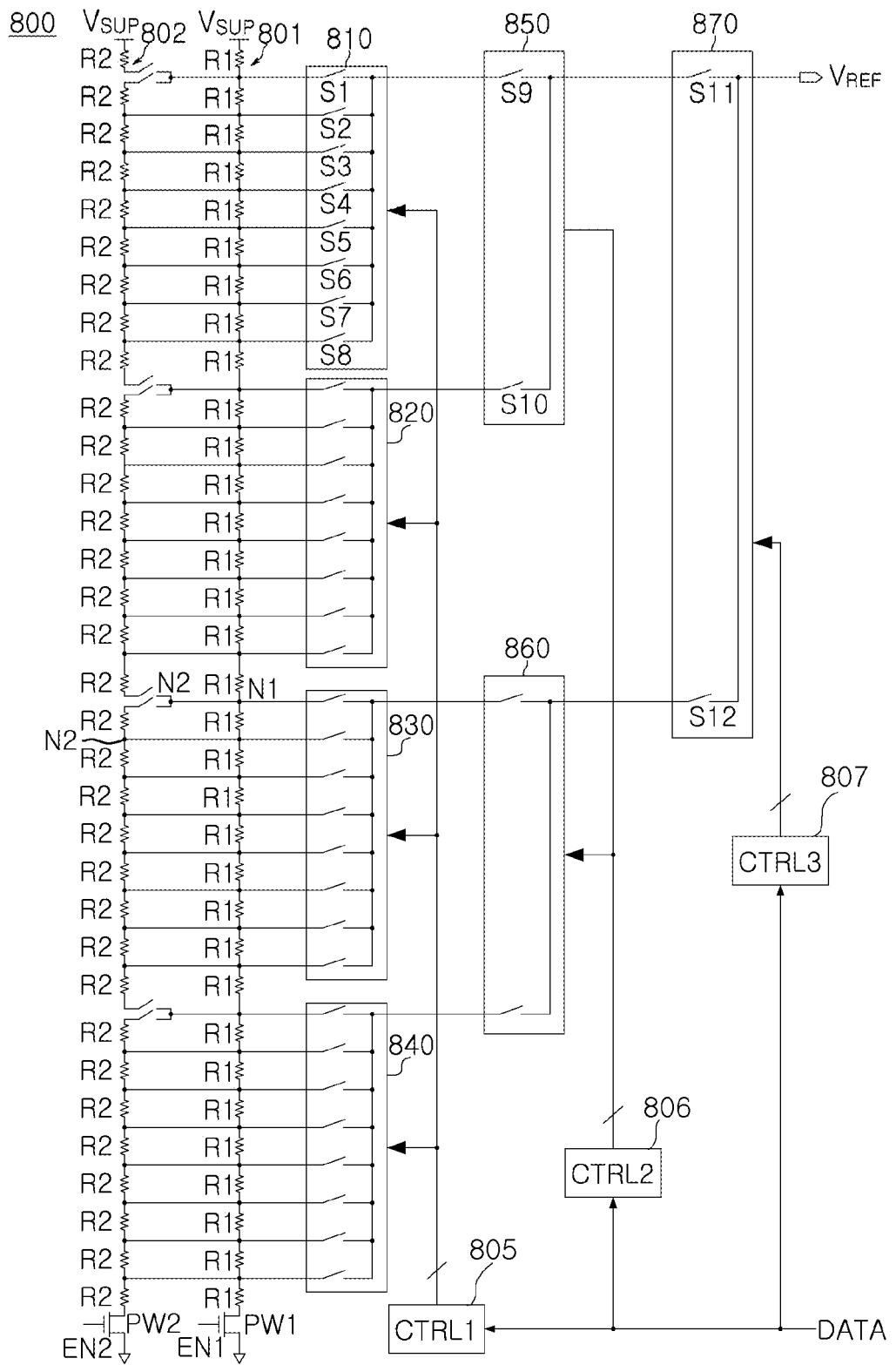

FIGS. 15 and 16 may be diagrams illustrating voltage generators 700 and 800 for generating a reference voltage VREF in response to 5-bit control data DATA. Referring to FIG. 15, the voltage generator 700 may include a first resistor chain 701, a second resistor chain 702, decoders 710 to 750, and switch controllers 705 and 706. The decoders 710 to 750 may include first to fourth sub-decoders 710 to 740 connected to the first resistor chain 701 and the second resistor chain 702, and fifth sub-decoder 750 connected to the first to fourth sub-decoders 710 to 740.

The switch controllers 705 and 706 may control turning on and off of the switches S1 to S12 included in the first to fifth sub-decoders 710 to 750 according to the 5-bit control data DATA. Similarly to the example described with reference to FIG. 14 above, the switches S1 to S8 included in each of the first to fourth sub-decoders 710 to 740 may be turned on and off by eight control signals output by the first switch controller 705. Further, the switches S9 to S12 included in the fifth sub-decoder 750 may be turned on and turned off by four control signals output by the second switch controller 706.

The operations of turning the switches S1 to S8 included in each of the first to fourth sub-decoders 710 to 740 on and off may be determined by three lower bits included in the control data DATA, which may be understood with reference to the example described with reference to Table 1 above. The turning each of the switches S9 to S12 included in the fifth sub-decoder 750 on and off may be determined by two upper bits included in the control data DATA as in Table 3.

TABLE 3

| DATA (two upper bits) | S9 | S10 | S11 | S12 |
|---|---|---|---|---|
| 00 | OFF | OFF | OFF | ON |
| 01 | OFF | OFF | ON | OFF |
| 10 | OFF | ON | OFF | OFF |
| 11 | ON | OFF | OFF | OFF |

Referring to FIG. 16, the voltage generator 800 may include a first voltage chain 801, a second voltage chain 802, decoders 810 to 870, and switch controllers 805 to 807. The decoders 810 to 870 may include first to fourth sub-decoders 810 to 840 connected to a first resistor chain 801 and a second resistor chain 802, fifth and sixth sub-decoders 850 and 860 connected to the first to fourth sub-decoders 810 to 840, and a seventh sub-decoder 870 connected to the fifth and sixth sub-decoders 850 and 860.

The switch controllers 805 to 807 may control switches S1 to S12 included in the decoders 810 to 870 in response to 5-bit control data DATA. As an example, the first switch controller 805 may generate eight control signals for controlling the switches S1 to S8 of each of the first to fourth sub-decoders 810 to 840 on the basis of three lower bits included in the control data DATA. The second switch controller 806 may generate two control signals controlling the switches S9 and S10 of each of the fifth and sixth sub-decoders 850 and 860 on the basis of the second upper bit of the control data DATA. The third switch controller 807 may generate two control signals for controlling the switches S11 and S12 of the seventh sub-decoder 870 using an uppermost bit of the control data DATA.

In the example embodiments described with reference to FIGS. 15 and 16, the second intermediate nodes N2 of the second resistor chain 702 and 802 may be connected to the second resistors R2 by the connection switches SW, or may be directly connected to the second resistors R2. In the example embodiments illustrated in FIGS. 15 and 16, one of the eight second intermediate nodes N2 may be connected to the second resistors R2 by the connection switches SW. Accordingly, the number of second intermediate nodes N2 may be greater than the number of connection switches SW.

However, the arrangement of the connection switches SW may be variously determined in some example embodiments. For example, as described above with reference to FIG. 12, odd-numbered second intermediate nodes N2 may be connected to the connection switches SW, and even-numbered second intermediate nodes N2 may be directly connected to the second resistors R2. In some example embodiments, as described with reference to FIG. 13, all of the second intermediate nodes N2 may be connected to the second resistors R2 by the connection switches SW. In some other example embodiments, as described with reference to FIG. 14, one of the four intermediate nodes N2 may be connected to the second resistors R2 by the connection switches SW.

FIGS. 17 to 20 are diagrams illustrating an operation of a voltage generator according to an example embodiment.

Referring to FIGS. 17 to 20, a voltage generator 900 may include a first resistor chain 901, a second resistor chain 902, decoders 910 to 930, and switch controllers 905 and 906. The switch controllers 905 and 906 may control the operation of the decoders 910 to 930 in response to 4-bit control data DATA. The first switch controller 905 may control the switches S1 to S8 included in the first and second sub-decoders 910 and 920 using three lower bits of the control data DATA, and the second switch controller 906 may control the switches S9 and S10 included in the third sub-decoder 930 using an uppermost bit of the control data DATA.

Figure 17:
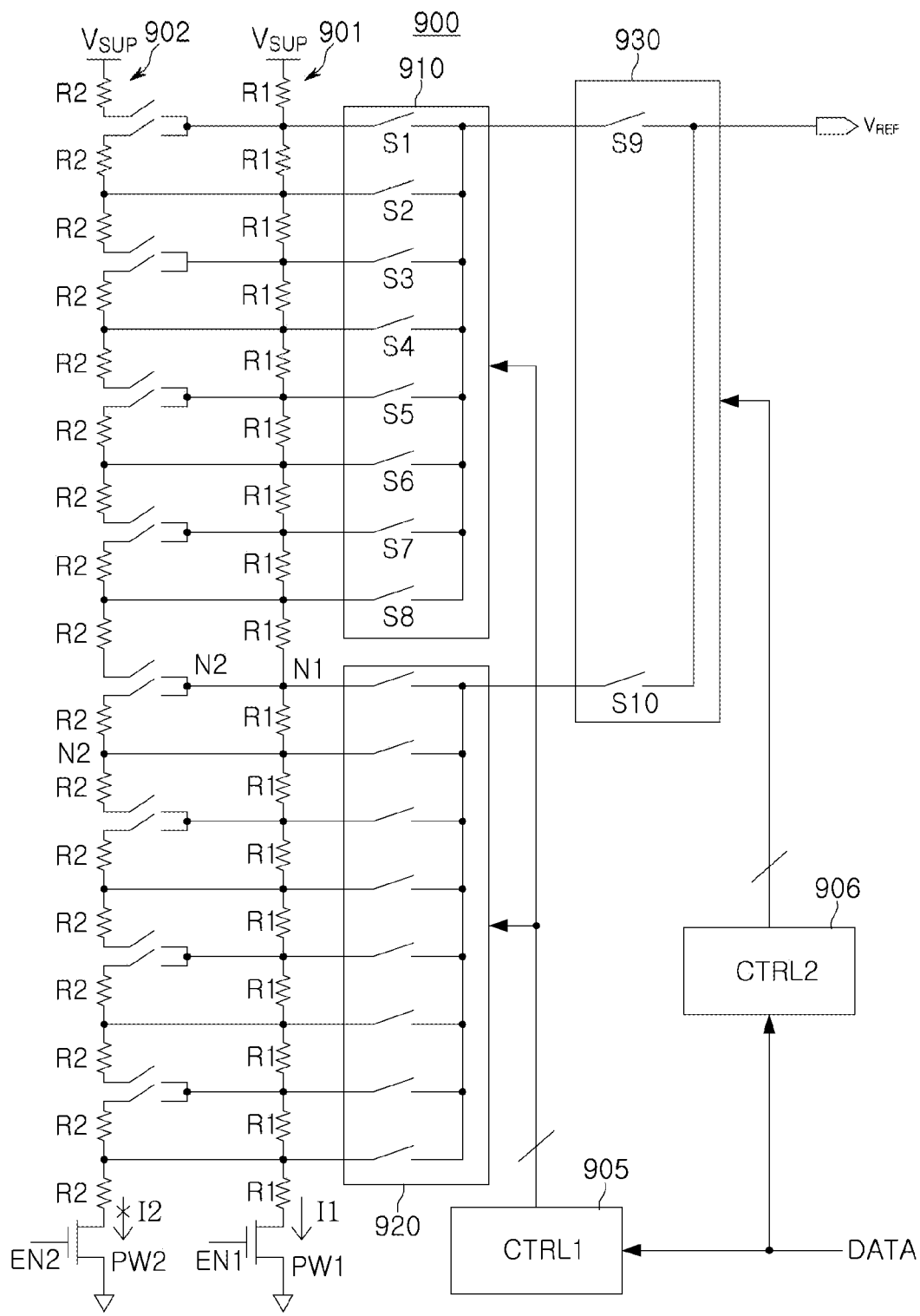
FIGS. 17 to 20 are diagrams illustrating an operation of a voltage generator according to an example embodiment of the present disclosure.

FIG. 17 may be a diagram illustrating an operation of when a semiconductor device including the voltage generator 900 is in a standby mode. Referring to FIG. 17, in the standby mode, the first power switch PW1 connected to the first resistors R1 may be turned on, and the second resistor sweetie PW2 connected to the second resistors R2 may be turned off. Accordingly, only the first current I1 may flow. However, as all the switches S1 to S10 included in the decoders 910 to 930 are turned off in the standby mode, the reference voltage VREF may not be output.

Figure 18:
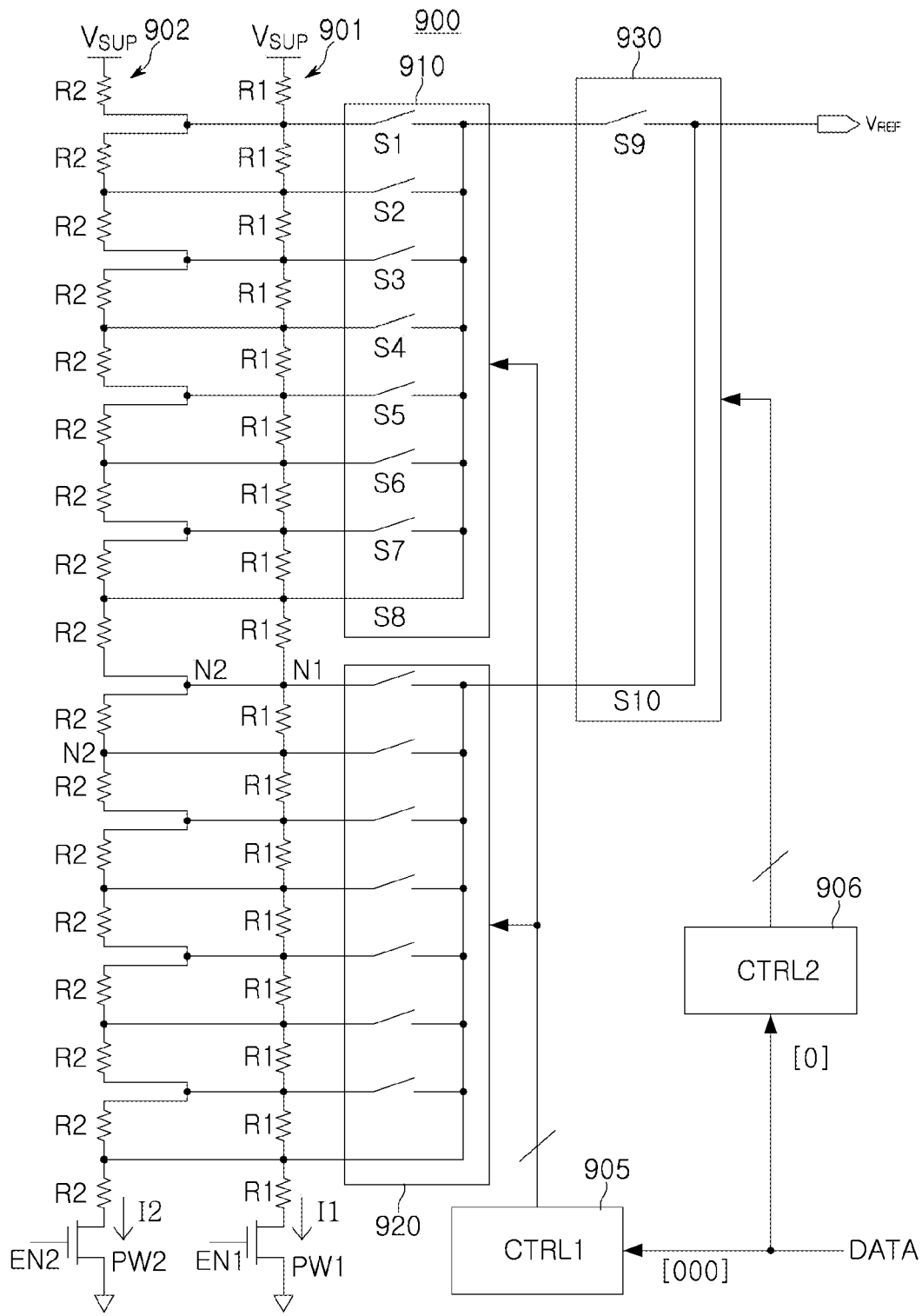
Figure 19:
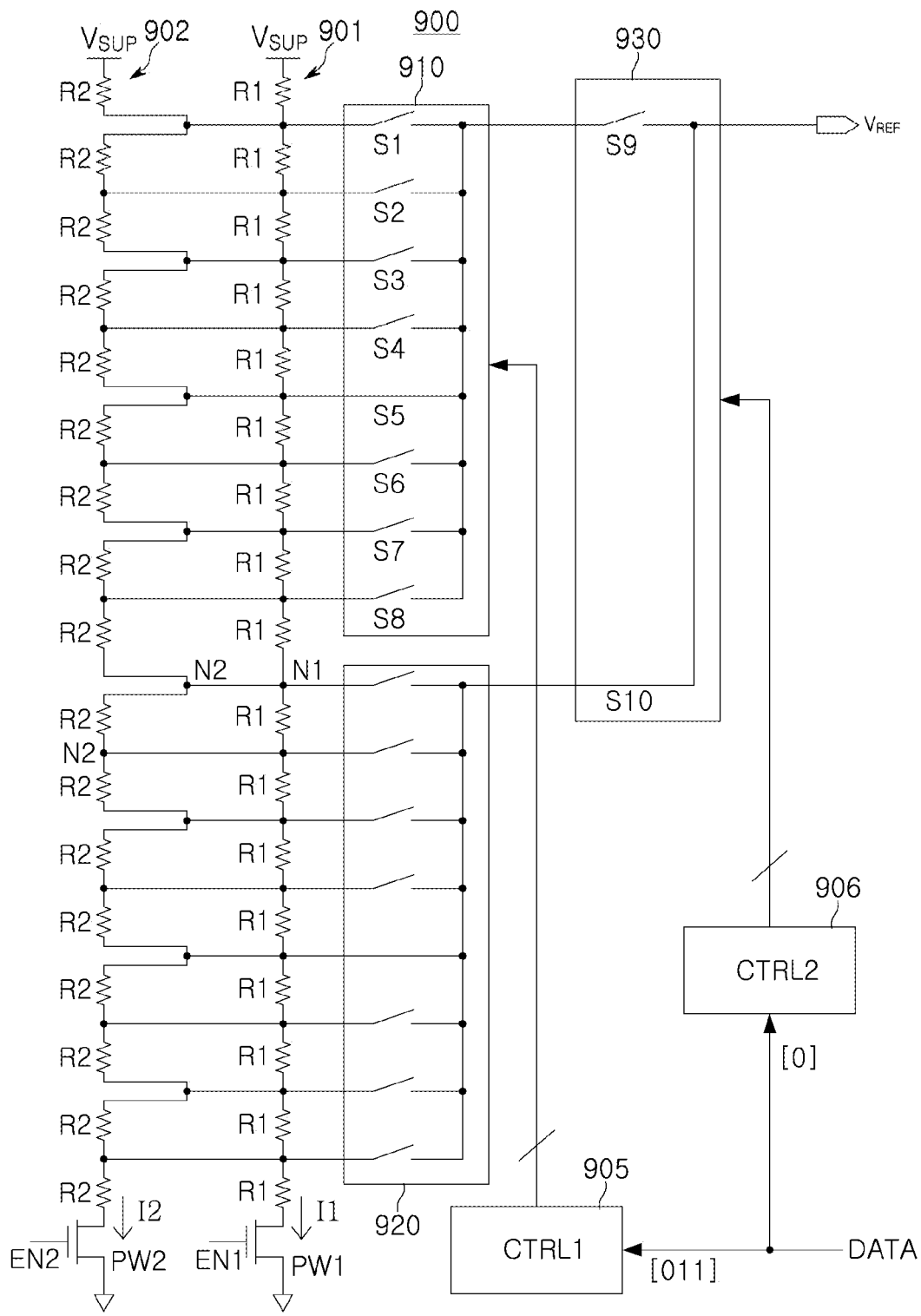
Figure 20:
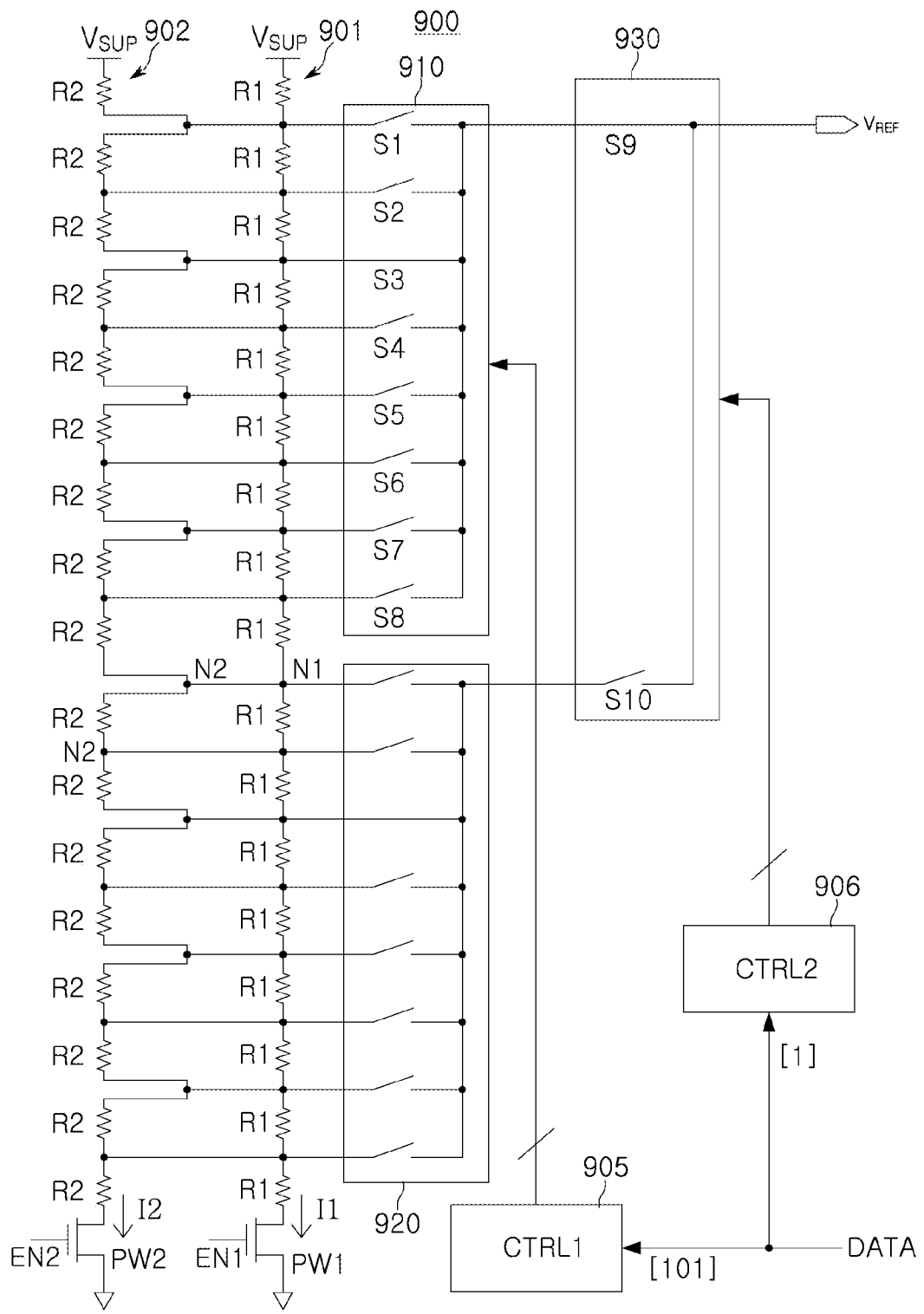

FIGS. 18 to 20 may be diagrams illustrating an operation of when a semiconductor device including the voltage generator 900 is in an active mode. Referring to FIGS. 18 to 20, in the active mode, both the first power switch PW1 and the second power switch PW2 may be turned on, and accordingly the first current I1 may be applied to the first resistor chain 901, and a second current I2 may be applied to the second resistor chain 902. Further, in the active mode, all connection switches SW connected to a portion of the second intermediate nodes N2 may be turned on, such that the first resistor chain 901 and the second resistor chain 902 may be connected to each other.

FIG. 18 may be a diagram illustrating an operation of the voltage generator 900 when the control data DATA is [0000]. Referring to FIG. 18, the eighth switch S8 may be turned on in each of the first sub-decoder 910 and the second sub-decoder 920 by [000], three lower bits of the control data DATA, and the other switches S1 to S7 may be turned off. Further, as an uppermost bit of the control data DATA is 0, the ninth switch S9 may be turned off and the tenth switch S10 may be turned on in the third sub-decoder 930.

FIG. 19 may be a diagram illustrating an operation of the voltage generator 900 when the control data DATA is [0011]. Referring to FIG. 19, the fifth switch S5 may be turned on in each of the first sub-decoder 910 and the second sub-decoder 920 by [011], which three lower bits of the control data DATA, and the other switches S1 to S4 and S6 to S8 may be turned off. Also, as an uppermost bit of the control data DATA is 0, the ninth switch S9 may be turned off and the tenth switch S10 may be turned on in the third sub-decoder 930.

FIG. 20 may be a diagram illustrating an operation of the voltage generator 900 when the control data DATA is [1101]. Referring to FIG. 20, the third switch S3 may be turned on in each of the first sub-decoder 910 and the second sub-decoder 920 by [101], there lower bits of the control data DATA, and the other switches S1 to S2 and S4 to S8 may be turned off. Also, as an uppermost bit of the control data DATA is 1, the ninth switch S9 may be turned on and the tenth switch S10 may be turned off in the third sub-decoder 930.

A resistance value of each of the first resistors R1 may be equal to or greater than a resistance value of each of the second resistors R2. Accordingly, in the active mode, the first current I1 may be equal to or lower than the second current I2. In the active mode, because the first current I1 and also the second current I2 are supplied to the decoders 910 to 930, in the structure in which a plurality of decoders share the first resistor chain 901 and the second resistor chain 902, an effect of a change of output of one of the plurality of decoders on the other decoders may be reduced. Also, since a current supplied to the decoders increases as compared to the example in which only the first resistor chain 901 is included, even when the level of the reference voltage VREF output by at least one of the decoders changes due to various noises, the original level may be swiftly recovered.

Figure 21:
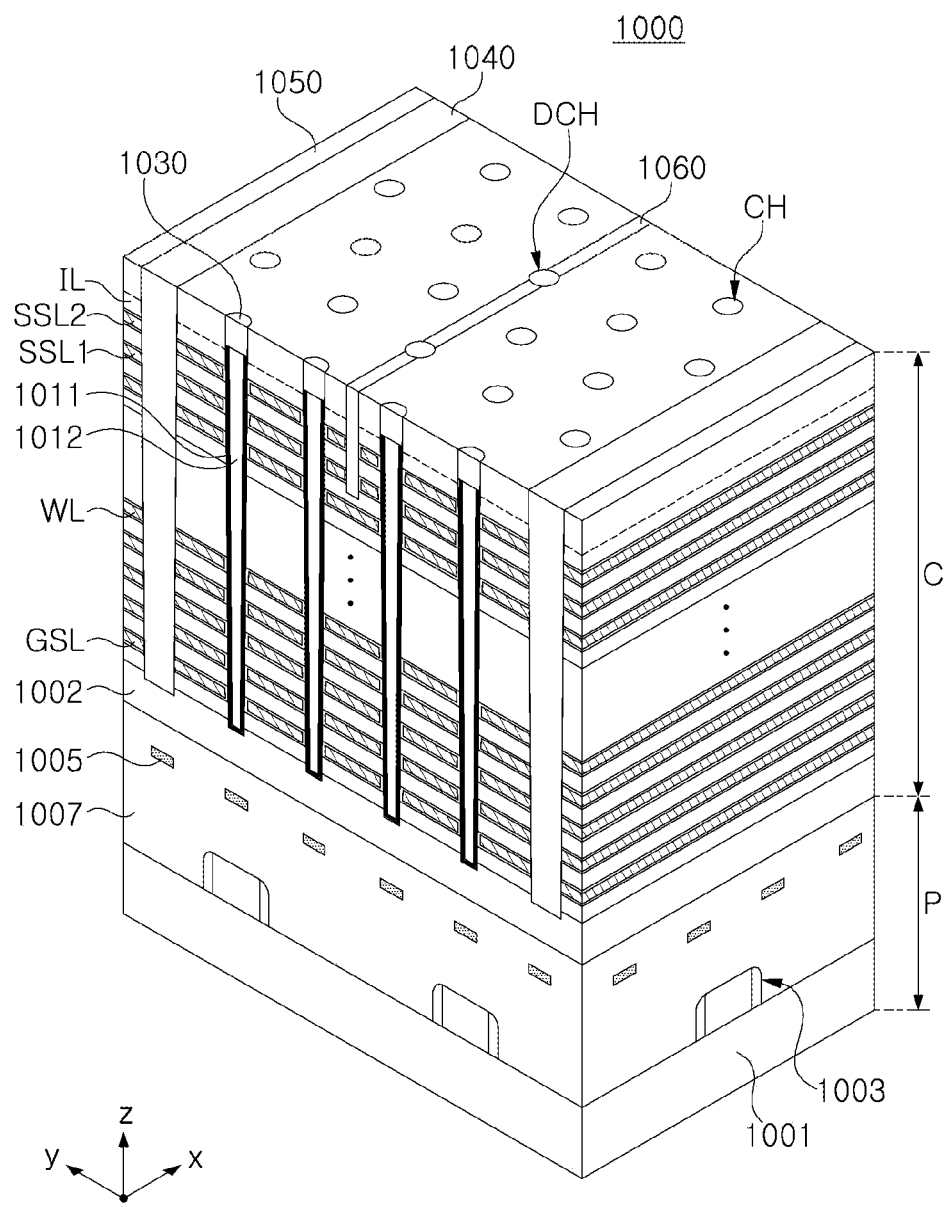
FIGS. 21 to 23 are diagrams illustrating memory devices according to some example embodiments of the present disclosure.
Figure 22:
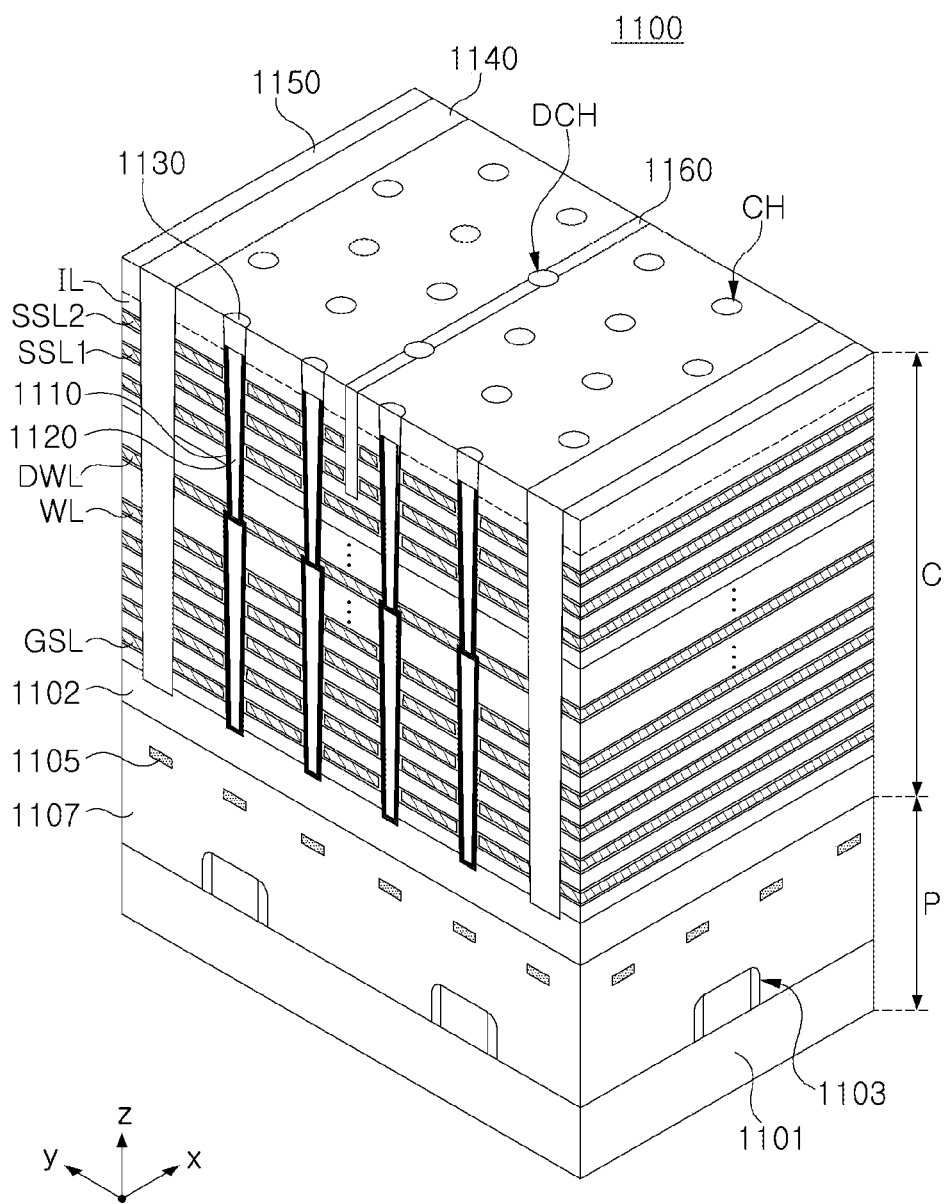
Figure 23:
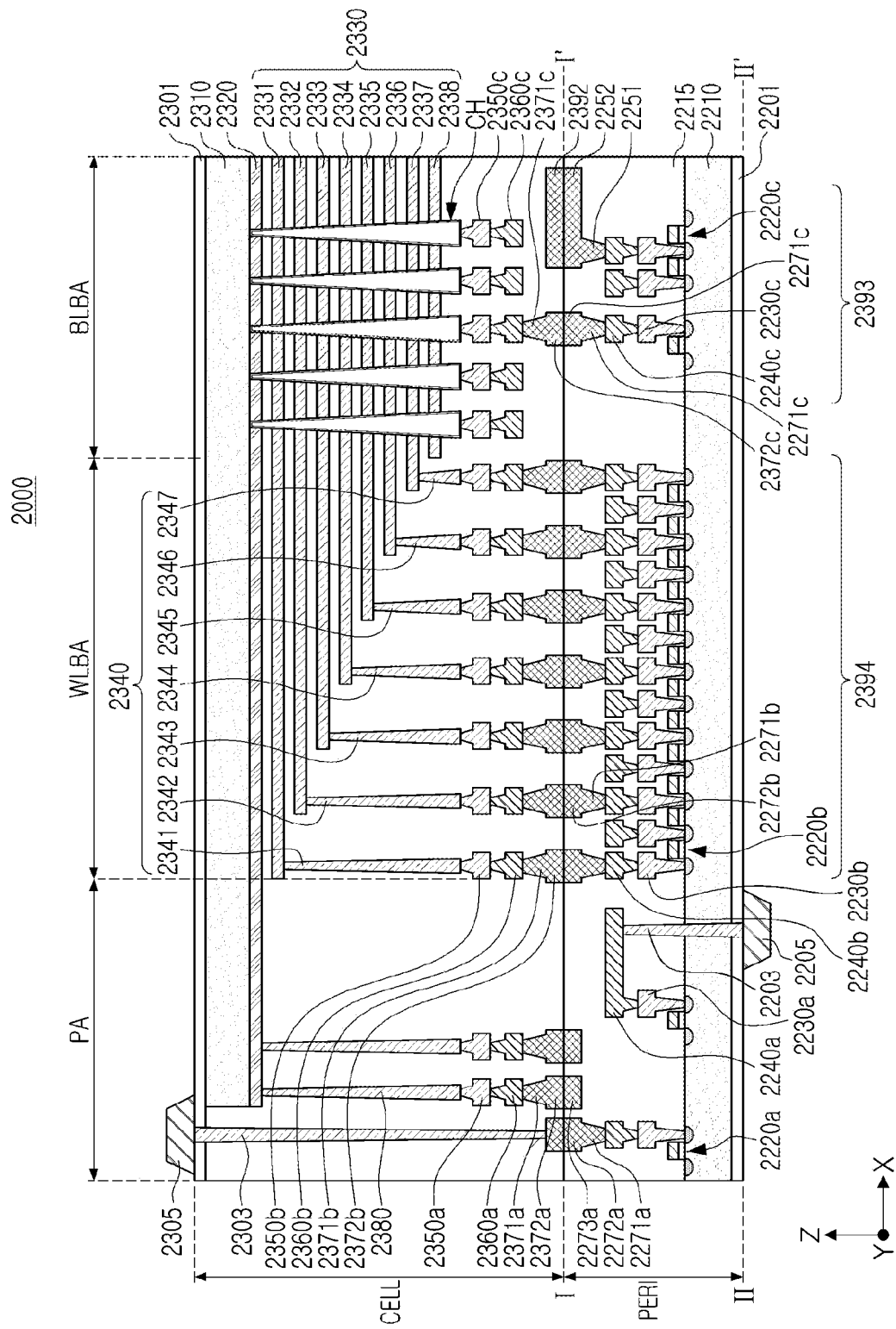

FIGS. 21 to 23 are diagrams illustrating memory devices according to some example embodiments.

The voltage generator described in the aforementioned example embodiments may be applied to a memory device. In the memory device, the voltage generator may supply various reference voltages necessary or desired for the memory device to execute a program operation, a read operation, an erase operation, and the like.

FIGS. 21 and 22 may be perspective diagrams illustrating memory devices 1000 and 1100 including a voltage generator according to an example embodiment. Referring to FIGS. 21 and 22, each of the memory devices 1000 and 1100 in the example embodiment may include a cell area C and a peripheral circuit area P disposed upwardly and downwardly. The peripheral circuit area P may be disposed in a lower portion of the cell area C, the peripheral circuit area P may include the first substrates 1001 and 1101, and the cell area C may include second substrates 1002 and 1102 different from the first substrates 1001 and 1101.

For example, the peripheral circuit area P may include a plurality of peripheral circuit devices 1003 and 1103 arranged on the first substrates 1001 and 1101, a plurality of wiring lines connected to the peripheral circuit devices 1003 and 1103, and first interlayer insulating layers 1007 and 1107 covering the peripheral circuit devices 1003 and 1103 and the wiring lines 1005 and 1105. The peripheral circuit area P may provide circuits necessary for driving the memory device 100, such as a page buffer, a row decoder, and the like, for example. Also, a voltage generator for generating a reference voltage may also be disposed in the peripheral circuit area P.

The second substrates 1002 and 1102 included in the cell area C may be disposed on the first interlayer insulating layers 1007 and 1107. The cell area C may include a ground select line GSL, word lines WL, and string select lines SSL1 and SSL2 stacked on the second substrates 1002 and 1102 and a plurality of insulating layers IL. The insulating layers IL may be alternately stacked with the ground select line GSL, the word lines WL, and the string select lines SSL1 and SSL2. The number of the ground select line GSL and the string select lines SSL1 and SSL2 is not limited to the example illustrated in FIGS. 21 and 22 and may be varied.

Further, the cell area C may include channel structures CH extending in a first direction (Z-axis direction) perpendicular to upper surfaces of the second substrates 1002 and 1102, and the channel structures CH may penetrate the ground select line GSL, the word lines WL, and the string select lines SSL1 and SSL2 and may be connected to the second substrates 1002 and 1102. The channel structures CH may include channel areas 1010 and 1110, buried insulating layers 1020 and 1120 filling the channel areas 1010 and 1110, and bit line connection layers 1030 and 1130. Each of the channel structures CH may be connected to at least one bit line through the bit line connection layers 1030 and 1130. The ground select line GSL, the word lines WL, the string select lines SSL1 and SSL2, the insulating layers IL, and the channel structures CH may be defined as a stack structure.

At least one gate insulating layer may be disposed on an external side of the channel areas 1010 and 1110. In an example embodiment, the gate insulating layer may include a tunneling layer, a charge storage layer, and a blocking layer sequentially disposed from the channel areas 1010 and 1110. In example embodiments, at least one of the tunneling layer, the charge storage layer, and the blocking layer may be surrounded by the ground select line GSL, the word lines WL, and the string select lines SSL1 and SSL2.

The ground select line GSL, the word lines WL, and the string select lines SSL1 and SSL2 may be covered by the interlayer insulating layers 1050 and 1150. Also, the ground select line GSL, the word lines WL, and the string select lines SSL1 and SSL2 may be divided into a plurality of blocks BLK1 and BLK2 by the separation layers 1040 and 1140. In an example embodiment, the string select lines SSL1 and SSL2 may be divided into a plurality of regions by the upper separation layers 1060 and 1160 between a pair of separation layers 1040 and 1140 adjacent to each other in the second direction (Y-axis direction).

In an example embodiment, dummy channel structures DCH may be provided in an area in which the upper separation layers 1060 and 1160 are disposed. The dummy channel structures DCH may have the same structure as that of the channel structures CH, and may not be connected to a bit line.

In the memory device 1100 according to the example embodiment illustrated in FIG. 22, each of the channel structures CH and the dummy channel structures DCH may include a lower channel structure and an upper channel structure. For example, to overcome a difficulty in process caused by an increase of the number of word lines WL, a portion of word lines WL may be stacked, a lower channel structure may be formed, the remaining word lines WL may be stacked, thereby forming an upper channel structure. Accordingly, as illustrated in FIG. 22, each of the channel structures CH and the dummy channel structures DCH may include an upper channel structure and a lower channel structure. For example, word lines penetrated by the lower channel structure and the lower channel structure may be defined as a lower stack structure, and word lines penetrated by the upper channel structure and the upper channel structure may be defined as an upper stack structure.

Referring to FIG. 23, the memory device 2000 according to an example embodiment may have a chip to chip (C2C) structure. The C2C structure may refer to a structure formed by manufacturing an upper chip including a cell area CELL on a first wafer, manufacturing a lower chip including a peripheral circuit area PERI on a second wafer different from the first wafer, and connecting the upper chip and the lower chip by a bonding method. For example, the bonding method may refer to a method of electrically connecting a bonding metal formed on an uppermost metal layer of an upper chip and a bonding metal formed on an uppermost metal layer of a lower chip. For example, when the bonding metal is formed of copper (Cu), the bonding method may be a Cu—Cu bonding method, and the bonding metal may also be formed of aluminum or tungsten.

Each of the peripheral circuit area PERI and the cell area CELL of the memory device 2000 may include an external pad bonding area PA, a word line bonding area WLBA, and a bit line bonding area BLBA.

The peripheral circuit area PERI may include a first substrate 2210, an interlayer insulating layer 2215, a plurality of circuit devices 2220a, 2220b, and 2220c formed on the first substrate 2210, first metal layers 2230a, 2230b, and 2230c connected to the plurality of circuit devices 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having a relatively high resistance, and the second metal layers 2240a, 2240b, and 2240c may be formed of copper having a relatively low resistance.

In the example embodiments, only the first metal layers 2230a, 2230b, and 2230c and the second metal layers 2240a, 2240b, and 2240c are illustrated, but an example embodiment thereof are not limited thereto, and at least one or more metal layers may further be formed on the second metal layers 2240a, 2240b, and 2240c. At least a portion of one or more metal layers formed on the second metal layers 2240a, 2240b, and 2240c may be formed of aluminum, which has resistance lower than that of copper forming the second metal layers 2240a, 2240b, and 2240c.

The interlayer insulating layer 215 may be disposed on the first substrate 2210 to cover the plurality of circuit devices 2220a, 2220b, and 2220c, first metal layers 2230a, 2230b, and 2230c, and second metal layers 2240a, 2240b, and 2240c, and may include an insulating material such as silicon oxide or silicon nitride.

Lower bonding metals 2271b and 2272b may be formed on the second metal layer 2240b of the word line bonding area WLBA. In the word line bonding area WLBA, the lower bonding metals 2271b and 2272b of the peripheral circuit area PERI may be electrically connected to the upper bonding metals 2371b and 2372b of the cell area CELL by a bonding method, and the lower bonding metals 2271b and 2272b and the upper bonding metals 2371b and 2372b may be formed of aluminum, copper, or tungsten.

The voltage generator described in the aforementioned example embodiments may be formed in the peripheral circuit area PERI. For example, the voltage generator may generate voltages necessary for the operation of the memory device 2000 using external power supplied from an external host or an external controller. The voltage generator may generate reference voltages of various levels desired or required for operation of the memory device 2000, and the row decoder 2394 and page buffer 2393 disposed in the peripheral circuit area PERI may execute a program operation, a read operation, and an erase operation using reference voltages.

The voltage generator included in the peripheral circuit area PERI may include a first resistor chain receiving a current in both the standby mode and the active mode, a second resistor chain receiving a current only in the active mode, and decoders. The decoders may share the first resistor chain and the second resistor chain. In example embodiments, when entering the active mode, a second current flowing in the second resistor chain may be applied to the decoders along with the first current flowing in the first resistor chain. Accordingly, when the level of the reference voltage output by one of the decoders is changed, a level change occurring in the reference voltages output by the other decoders may be reduced. Also, after the level is changed, reference voltages output by the other decoders may be swiftly restored to the original levels.

The cell area CELL may provide at least one memory block. The cell area CELL may include a second substrate 2310 and a common source line 2320. On the second substrate 2310, a plurality of word lines 2331 to 2338 and 2330 may be stacked along a direction (Z-axis direction) perpendicular to the upper surface of the second substrate 2310. String select lines and ground select lines may be disposed on each of the upper and lower portions of the word lines 2330, and a plurality of word lines 2330 may be disposed between the string select lines and the ground select line.

In the bit line bonding area BLBA, the channel structure CH may extend in a direction perpendicular to the upper surface of the second substrate 2310 and may penetrate the word lines 2330, the string select lines, and the ground select lines. The channel structure CH may include a data storage layer, a channel layer, and a buried insulating layer, and the channel layer may be electrically connected to the first metal layer 2350c and the second metal layer 2360c. For example, the first metal layer 2350c may be a bit line contact, and the second metal layer 2360c may be a bit line. In an example embodiment, the bit line 2360c may extend along a first direction (Y-axis direction) parallel to the upper surface of the second substrate 2310.

In the example embodiment illustrated in FIG. 23, an area in which the channel structure CH and the bit line 2360c are disposed may be defined as the bit line bonding area BLBA. The bit line 2360c may be electrically connected to the circuit devices 2220c providing the page buffer 2393 in the peripheral circuit area PERI in the bit line bonding area BLBA. As an example, the bit line 2360c may be connected to the upper bonding metals 2371c and 2372c in the peripheral circuit area PERI, and the upper bonding metals 2371c and 2372c may be connected to the lower bonding metals 2271c and 2272c connected to the circuit devices 2220c of the page buffer 393.

In the word line bonding area WLBA, the word lines 2330 may extend along a second direction (X-axis direction) parallel to the upper surface of the second substrate 2310, and may be connected to the plurality of cell contact plugs 2341 to 2347 (2340). The word lines 2330 and the cell contact plugs 2340 may be connected to each other in pads provided by at least a portion of the word lines 2330 extending in the second direction by different lengths. A first metal layer 2350b and a second metal layer 2360b may be connected in order to an upper portion of the cell contact plugs 2340 connected to the word lines 2330. The cell contact plugs 2340 may be connected to the peripheral circuit area PERI through the upper bonding metals 2371b and 2372b of the cell area CELL and the lower bonding metals 271b and 2272b of the peripheral circuit area PERI in the word line bonding area WLBA.

The cell contact plugs 2340 may be electrically connected to the circuit devices 2220b providing the row decoder 2394 in the peripheral circuit area PERI. In an example embodiment, operating voltages of the circuit devices 2220b providing the row decoder 2394 may be different from operating voltages of the circuit devices 2220c providing the page buffer 2393. For example, the operating voltages of the circuit devices 2220c providing the page buffer 2393 may be higher than the operating voltages of the circuit devices 2220b providing the row decoder 2394.

A common source line contact plug 2380 may be disposed in the external pad bonding area PA. The common source line contact plug 2380 may be formed of a conductive material such as a metal, a metal compound, or polysilicon, and may be electrically connected to the common source line 2320. A first metal layer 2350a and a second metal layer 2360a may be stacked in order on the common source line contact plug 2380. For example, an area in which the common source line contact plug 2380, the first metal layer 2350a, and the second metal layer 2360a are disposed may be defined as an external pad bonding area PA.

Input/output pads 2205 and 2305 may be disposed in the external pad bonding area PA. Referring to FIG. 23, a lower insulating layer 2201 covering a lower surface of the first substrate 2210 may be formed in a lower portion of the first substrate 2210, and a first input/output pad 2205 may be formed on the lower insulating layer 2201. The first input/output pad 2205 may be connected to at least one of the plurality of circuit devices 2220a, 2220b, and 2220c disposed in the peripheral circuit area PERI through the first input/output contact plug 2203, and may be separated from the first substrate 2210 by the lower insulating film 2201. Also, a side surface insulating layer may be disposed between the first input/output contact plug 2203 and the first substrate 2210 and may electrically separate the first input/output contact plug 2203 from the first substrate 2210.

Referring to FIG. 23, an upper insulating layer 2301 covering an upper surface of the second substrate 2310 may be formed on the second substrate 2310, and a second input/output pad 2305 may be disposed on the upper insulating layer 2301. The second input/output pad 2305 may be connected to at least one of the plurality of circuit devices 2220a, 2220b, and 2220c disposed in the peripheral circuit area PERI through the second input/output contact plug 2303.

In example embodiments, the second substrate 2310 and the common source line 2320 may not be disposed in an area in which the second input/output contact plug 2303 is disposed. Also, the second input/output pad 2305 may not overlap the word lines 2380 in the third direction (Z-axis direction). Referring to FIG. 23, the second input/output contact plug 2303 may be separated from the second substrate 2310 in a direction parallel to the upper surface of the second substrate 2310, and may penetrate the interlayer insulating layer 2315 disposed in the cell area CELL and may be connected to the second input/output pad 2305.

In some example embodiments, the first input/output pad 2205 and the second input/output pad 2305 may be selectively formed. For example, the memory device 2000 may include only the first input/output pad 2205 disposed above the first substrate 2201, or only the second input/output pad 2305 disposed above the second substrate 2301. In some example embodiments, the memory device 2000 may include both the first input/output pad 2205 and the second input/output pad 2305.

In each of the outer pad bonding area PA and the bit line bonding area BLBA included in each of the cell area CELL and the peripheral circuit area PERI, a metal pattern of the uppermost metal layer may be present as a dummy pattern, or the uppermost metal layer may be empty.

In the external pad bonding area PA, the memory device 2000 may form a lower metal pattern 2273a having the same shape as that of the upper metal pattern 2372a disposed in the cell area CELL on the uppermost metal layer of the peripheral circuit area PERI to correspond to the upper metal pattern 2372a formed on the uppermost metal layer disposed in the cell area CEL. The lower metal pattern 2273a formed on the uppermost metal layer of the peripheral circuit area PERI may not be connected to a separate contact in the peripheral circuit area PERI. Similarly, an upper metal pattern having the same shape as that of the lower metal pattern disposed in the peripheral circuit area PERI may be formed on the upper metal layer of the cell area CELL to correspond to the lower metal pattern formed on the uppermost metal layer of the peripheral circuit area PERI.

Lower bonding metals 2271b and 2272b may be formed on the second metal layer 2240b of the word line bonding area WLBA. In the word line bonding area WLBA, the lower bonding metals 2271b and 2272b of the peripheral circuit area PERI may be electrically connected to the upper bonding metals 2231b and 2372b of the cell area CELL by bonding.

Also, in the bit line bonding area BLBA, the upper metal pattern 2392 having the same shape as that of the lower metal pattern 2252 of the peripheral circuit area PERI may be formed on the uppermost metal layer of the cell area CELL to correspond to the lower metal pattern 2252 formed on the uppermost metal layer of the peripheral circuit area PERI. A contact may not be formed on the upper metal pattern 2392 formed on the uppermost metal layer of the cell area CELL.

According to the aforementioned example embodiment, the voltage generator may include a first resistor chain and a second resistor chain, and a current may be applied to the second resistor chain only in the active mode in which reference voltages are output, differently from the first resistor chain. Accordingly, power consumption of the voltage generator may be reduced. Further, by connecting a plurality of decoders for outputting different reference voltages to the first resistor chain and the second resistor chain, a circuit area desired or required to output the reference voltages may be reduced, and noise properties may be addressed.

Various elements (e.g., a voltage generating circuit or voltage generator, a control logic, a band gap reference circuit, a regulator, various decoders, and/or various controllers) disclosed in the present disclosure as black boxes may be implemented as processing circuitry such as hardware including logic circuits or a combination of hardware and software such as a processor executing software. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been illustrated and described above, it will be apparent to those skilled in the art that modifications and variations could be made without departing from the scope of the present disclosure as defined by the appended claims.

What is claimed is:

1. A memory device, comprising:
   a memory cell area having a plurality of memory cells; and
   a peripheral circuit area including peripheral circuits configured to control the memory cells, the peripheral circuits connected to the memory cells by at least one of bit lines, word lines, and select lines,
   wherein the peripheral circuits include a row decoder connected to the memory cells by the word lines and the select lines, a page buffer connected to the memory cells by the bit lines, a control logic configured to control the row decoder and the page buffer, and a reference voltage generator configured to output at least one reference voltage in response to control data of the control logic, and
   wherein the reference voltage generator includes a first resistor chain including first resistors connected in series between a first power node and a second power node, a second resistor chain including second resistors connected in series between the first power node and the second power node, and a plurality of decoders connected to the first resistor chain and the second resistor chain.

2. The memory device of claim 1, wherein a resistance value of each of the first resistors is equal to or greater than a resistance value of each of the second resistors.

3. The memory device of claim 1,
   wherein the first resistor chain includes a first power switch connected between the first resistors and the second power node, and
   wherein the second resistor chain includes a second power switch connected between the second resistors and the second power node.

4. The memory device of claim 3, wherein a time for which the first power switch is turned on is longer than a time for which the second power switch is turned on.

5. The memory device of claim 4, wherein the first power switch is turned on and the second power switch is turned off, while the peripheral circuit area operates in a standby mode.

6. The memory device of claim 1,
   wherein the first resistor chain includes first intermediate nodes between the first resistors,
   wherein the second resistor chain includes second intermediate nodes between the second resistors, and
   wherein the first intermediate nodes are connected to the second intermediate nodes by connection wires.

7. The memory device of claim 6,
   wherein the second intermediate nodes include switching nodes connected to at least a portion of the second resistors by connection switches, and connection nodes directly connected to another portion of the second resistors, and wherein a portion of the connection wirings connect a portion of the first intermediate nodes to the switching nodes.

8. The memory device of claim 7, wherein a number of the first intermediate nodes is same as a number of the second intermediate nodes.

9. The memory device of claim 7, wherein, in the second resistor chain, the connection nodes and the switching nodes are alternately disposed.

10. The memory device of claim 7, wherein in the second resistor chain, number of the connection nodes is greater than a number of the switching nodes.

11. The memory device of claim 7, wherein the control logic is configured to turn off the connection switches in a standby mode and turn on the connection switches in an active mode.

12. The memory device of claim 1, further comprising:
a switch controller configured to control a plurality of switches included in each of the decoders,
wherein the control data is data of N bits, where N is a natural number equal to or greater than 2, and
wherein the switch controller includes a first switch controller configured to control at least a portion of the switches in response to an n number of lower bits of the control data, and a second switch controller configured to control the remaining switches in response to an m number of upper bits of the control data.

13. The memory device of claim 12, wherein among the switches, a number of the switches controlled by the first switch controller is greater than a number of switches controlled by the second switch controller.

14. The memory device of claim 12, wherein the first switch controller is configured to generate 2n control signals in response to n lower bits of the control data, and the second switch controller configured to generate 2 m control signals in response to m upper bits of the control data.

15. A voltage generator, comprising:
a band-gap reference circuit configured to generate a bias voltage;
a low-dropout regulator (LDO) regulator configured to generate a first power voltage and a second power voltage, based on the bias voltage; and
a reference voltage generator including a first resistor chain including first resistors connected between the first power voltage and the second power voltage, a second resistor chain including second resistors connected between the first power voltage and the second power voltage, and a plurality of decoders connected to at least one of the first resistor chain and the second resistor chain and configured to output reference voltages,
wherein the reference voltage generator is configured such that,
in a standby mode, a first standby current flows in the first resistor chain, and a second standby current, which is lower than the first standby current, flows in the second resistor chain, and in an active mode, a first operating current flows in the first resistor chain and a second operating current, which is larger than the first operating current, flows in the second resistor chain.

16. The voltage generator of claim 15,
wherein the first resistor chain includes a first power switch connected between the first resistors and the second power voltage and configured to be turned on in the standby mode and the active mode, and
wherein the second resistor chain includes a second power switch connected between the second resistors and the second power voltage, and configured to be turned off in the standby mode and turned on in the active mode.

17. The voltage generator of claim 15, wherein the decoders are configured to be electrically connected to the first resistor chain and are electrically separated from the second resistor chain in the standby mode, and the decoders are configured to be electrically connected to the first resistor chain and the second resistor chain in the active mode.

18. The voltage generator of claim 15,
wherein the first resistor chain includes first intermediate nodes between the first resistors, and the second resistor chain includes second intermediate nodes between the second resistors, and
wherein at least a portion of the second intermediate nodes is connected to corresponding ones of the second resistors by connection switches.

19. The voltage generator of claim 18, wherein, among the second intermediate nodes, a second intermediate node closest to the first power voltage is connected to corresponding ones of the second resistors by the connection switches.

20. A memory device, comprising:
a memory cell area having first pads; and
a peripheral circuit area having second pads, and connected to the memory cell area by coupling the first pads and the second pads in a first direction,
wherein the peripheral circuit area further includes a row decoder connected to memory cells in the memory cell area by word lines and select lines, a page buffer connected to the memory cells by bit lines, a control logic configured to control the row decoder and the page buffer, and a voltage generator configured to output reference voltages in response to a control command of the control logic,
wherein the voltage generator includes a first resistor chain having first resistors connected to each other in series and a first power switch, a second resistor chain having second resistors connected to each other in series and a second power switch, and a plurality of decoders connected to first intermediate nodes between the first resistors and second intermediate nodes between the second resistors, and
wherein the plurality of decoders are connected to each other in parallel and are configured to simultaneously output the reference voltages different from each other.

* * * * *